United States Patent
Lee et al.

(10) Patent No.: US 9,812,140 B2
(45) Date of Patent: Nov. 7, 2017

(54) METHOD AND APPARATUS FOR QUADRATURE MIRROR FILTERING

(71) Applicant: SAMSUNG ELECTRONICS CO., LTD., Suwon-si, Gyeonggi-do (KR)

(72) Inventors: Kang-eun Lee, Hwaseong-si (KR); Do-hyung Kim, Hwaseong-si (KR); Chang-yong Son, Gunpo-si (KR); Si-hwa Lee, Seoul (KR); Seok-hwan Jo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 14/524,306

(22) Filed: Oct. 27, 2014

(65) Prior Publication Data
US 2015/0120306 A1   Apr. 30, 2015

(30) Foreign Application Priority Data

Oct. 28, 2013  (KR) ........................ 10-2013-0128645

(51) Int. Cl.
| | |
|---|---|
| *G10L 19/00* | (2013.01) |
| *G10L 19/02* | (2013.01) |
| *G06F 9/355* | (2006.01) |
| *H03H 17/02* | (2006.01) |

(52) U.S. Cl.
CPC ........ *G10L 19/0204* (2013.01); *G06F 9/3552* (2013.01); *H03H 17/0272* (2013.01)

(58) Field of Classification Search
CPC ..................................... G10L 19/00
USPC ........................................ 704/500
See application file for complete search history.

(56) References Cited

U.S. PATENT DOCUMENTS

| | | | |
|---|---|---|---|
| 5,282,275 A | 1/1994 | André et al. | |
| 5,436,940 A | 7/1995 | Nguyen | |
| 5,526,464 A | 6/1996 | Mermelstein | |
| 6,363,406 B1 * | 3/2002 | Takano | H03H 17/0266 708/316 |
| 7,333,929 B1 | 2/2008 | Chmounk et al. | |

(Continued)

FOREIGN PATENT DOCUMENTS

| | | |
|---|---|---|
| WO | 01/11609 A1 | 2/2001 |
| WO | 2011/021790 A2 | 2/2011 |
| WO | 2012/110415 A1 | 8/2012 |

OTHER PUBLICATIONS

PCT International Search Report and Written Opinion of the International Searching Authority dated Jan. 20, 2015 in International Patent Application No. PCT/KR2014/010168 (12 pages).

(Continued)

*Primary Examiner* — Jakieda Jackson
(74) *Attorney, Agent, or Firm* — Staas & Halsey LLP

(57) ABSTRACT

A method of performing quadrature mirror filter (QMF) synthesis filtering includes recording new samples corresponding to a current time slot at positions of samples to be discarded in a first array that includes modulated QMF sub-band samples. The method further includes extracting samples from the first array to remove aliasing between adjacent sub-bands, determining filter coefficients corresponding to the extracted samples by using modulo operation, and synthesizing a time domain sample where aliasing is removed by using the extracted samples and the filter coefficients.

14 Claims, 20 Drawing Sheets

(56) References Cited

U.S. PATENT DOCUMENTS

| | | | |
|---|---|---|---|
| 2006/0195498 A1 | 8/2006 | Dobbek et al. | |
| 2008/0263285 A1 | 10/2008 | Sharma et al. | |
| 2009/0319283 A1* | 12/2009 | Schnell | G10L 19/0204 704/503 |
| 2011/0257980 A1* | 10/2011 | Gao | G10L 21/038 704/500 |
| 2011/0257984 A1* | 10/2011 | Virette | G10L 19/26 704/503 |

OTHER PUBLICATIONS

Extended European Search Report dated Feb. 10, 2017 from European Patent Application No. 14858246.3, 10 pages.

Chivukula et al., "Fast Algorithms for Low-Delay SBR Filterbanks in MPEG-4 AAC-ELD", IEEE Transactions on Audio, Speech and Language Processing, IEEE, vol. 20, No. 3, Mar. 2012, XP011412231, pp. 1022-1031.

"Text of ISO/IEC 14496-3:2001/FDAM1", MPEG Meeting; Mar. 10, 2003-Mar. 14, 2003; Pattaya; (Motion Picture Expert Group or ISO/IEC JTC1/SC29/WG11), No. N5570, Mar. 28, 2003, XP030012750, 127 pages.

Hsu et al., "Fast Complex Quadrature Mirror Filterbanks for MPEG-4 HE-AAC", AES Convention 121, Oct. 5, 2006, XP040507794, 13 pages.

\* cited by examiner

FIG. 5

| time slot | sub band | array | m=0 | m=1 | m=2 | ... | m=8 | m=9 |
|---|---|---|---|---|---|---|---|---|
| l=0 | n=0 | array g | g[0]=V[0] | g[64]=V[192] | g[64*2]=V[256] | | g[64*8]=V[1024] | g[64*9]=V[1216] |
| | | array c | c[0] | c[1] | c[2] | | c[8] | c[9] |
| | | g*c | V[0]*c[0] | V[192]*c[1] | V[256]*c[2] | | V[1024]*c[8] | V[1216]*c[9] |
| | n=1 | array g | g[1]=V[1] | g[64+1]=V[193] | g[64*2+1]=V[257] | | g[64*9+1]=V[1025] | g[64*9+1]=V[1217] |
| | | array c | c[10] | c[11] | c[12] | | c[18] | c[19] |
| | | g*c | V[1]*c[10] | V[193]*c[11] | V[257]*c[12] | | V[1025]*c[18] | V[1217]*c[19] |
| | n=2 | array g | g[2]=V[2] | g[64+2]=V[194] | g[64*2+2]=V[258] | | g[64*9+2]=V[1026] | g[64*9+2]=V[1218] |
| | | array c | c[20] | c[21] | c[22] | | c[28] | c[29] |
| | | g*c | V[2]*c[20] | V[194]*c[21] | V[258]*c[22] | ... | V[1026]*c[28] | V[1218]*c[29] |
| | ... | | | | | | | |
| | n=63 | | | | | | | |
| l=1 | n=0 | array g | g[0]=V[0] | g[64]=V[192] | g[64*2]=V[256] | | g[64*8]=V[1024] | g[64*9]=V[1216] |
| | | array c | c[0] | c[1] | c[2] | | c[8] | c[9] |
| | | g*c | V[0]*c[0] | V[192]*c[1] | V[256]*c[2] | | V[1024]*c[8] | V[1216]*c[9] |
| | n=1 | array g | g[1]=V[1] | g[64+1]=V[193] | g[64*2+1]=V[257] | | g[64*9+1]=V[1025] | g[64*9+1]=V[1217] |
| | | array c | c[10] | c[11] | c[12] | | c[18] | c[19] |
| | | g*c | V[1]*c[10] | V[193]*c[11] | V[257]*c[12] | | V[1025]*c[18] | V[1217]*c[19] |
| | n=2 | array g | g[2]=V[2] | g[64+2]=V[194] | g[64*2+2]=V[258] | | g[64*9+2]=V[1026] | g[64*9+2]=V[1218] |
| | | array c | c[20] | c[21] | c[22] | | c[28] | c[29] |
| | | g*c | V[2]*c[20] | V[194]*c[21] | V[258]*c[22] | | V[1026]*c[28] | V[1218]*c[29] |

FIG. 12

| time slot | sub band | array | m=0 | m=1 | m=2 | ... | m=8 | m=9 |
|---|---|---|---|---|---|---|---|---|
| l=0 | n=0 | array g | g[0]=V[0] | g[64]=V[192] | g[64*2]=V[256] | ... | g[64*8]=V[1024] | g[64*9]=V[1216] |
| | | array c' | c'[0]=c[0] | c'[1]=c[1] | c'[2]=c[2] | | c'[8]=c[8] | c'[9]=c[9] |
| | | g*c' | V[0]*c[0] | V[192]*c[1] | V[256]*c[2] | | V[1024]*c[8] | V[1216]*c[9] |
| | n=1 | array g | g[1]=V[1] | g[64+1]=V[193] | g[64*2+1]=V[257] | | g[64*8+1]=V[1025] | g[64*9+1]=V[1217] |
| | | array c' | c'[20]=c[10] | c'[21]=c[11] | c'[22]=c[12] | | c'[28]=c[18] | c'[29]=c[19] |
| | | g*c' | V[1]*c[10] | V[193]*c[11] | V[257]*c[12] | | V[1025]*c[18] | V[1217]*c[19] |
| | n=2 | array g | g[2]=V[2] | g[64+2]=V[194] | g[64*2+2]=V[258] | | g[64*8+2]=V[1026] | g[64*9+2]=V[1218] |
| | | array c' | c'[40]=c[20] | c'[41]=c[21] | c'[42]=c[22] | | c'[48]=c[28] | c'[49]=c[29] |
| | | g*c' | V[2]*c[20] | V[194]*c[21] | V[258]*c[22] | | V[1026]*c[28] | V[1218]*c[29] |
| | ... | | | | ... | | ... | ... |
| | n=63 | | | | | | | |
| l=1 | n=0 | array g | g[0]=V[64] | g[64]=V[128] | g[64*2]=V[320] | | g[64*8]=V[1088] | g[64*9]=V[1152] |
| | | array c' | c'[1]=c[1] | c'[2]=c[2] | c'[3]=c[3] | | c'[9]=c[9] | c'[10]=c[0] |
| | | g*c' | V[64]*c[1] | V[128]*c[2] | V[320]*c[3] | | V[1088]*c[9] | V[1152]*c[0] |
| | n=1 | array g | g[1]=V[65] | g[64+1]=V[129] | g[64*2+1]=V[321] | | g[64*8+1]=V[1089] | g[64*9+1]=V[1153] |
| | | array c' | c'[21]=c[11] | c'[22]=c[12] | c'[23]=c[13] | | c'[29]=c[19] | c'[30]=c[10] |
| | | g*c' | V[65]*c[11] | V[129]*c[12] | V[321]*c[13] | | V[1089]*c[19] | V[1153]*c[10] |
| | n=2 | array g | g[2]=V[66] | g[64+2]=V[130] | g[64*2+2]=V[322] | | g[64*8+2]=V[1090] | g[64*9+2]=V[1154] |
| | | array c' | c'[41]=c[21] | c'[42]=c[22] | c'[43]=c[23] | | c'[49]=c[29] | c'[50]=c[20] |
| | | g*c' | V[66]*c[21] | V[130]*c[22] | V[322]*c[23] | | V[1090]*c[29] | V[1154]*c[20] |

METHOD AND APPARATUS FOR QUADRATURE MIRROR FILTERING

CROSS-REFERENCE TO RELATED APPLICATIONS

This application claims the benefit of Korean Patent Application No. 10-2013-0128645, filed on Oct. 28, 2013, in the Korean Intellectual Property Office, the disclosure of which is incorporated herein in its entirety by reference.

BACKGROUND

1. Field

One or more embodiments disclosed herein relate to a method and apparatus for performing analysis filtering or synthesis filtering using a quadrature mirror filter (QMF) bank.

2. Description of the Related Art

A digital audio coding method is a very important factor not only in the field of mobile devices but also in the field of home audio systems. Among audio coding algorithms according to ISO MPEG audio standards, MPEG layer-3 (MP3) may be used for broadcasting and multimedia contents. AAC, HE-AAC v1, and HE-AAC v2, for example, are improvements of MP3 which provide high quality music at a relatively less bit rate. According to an MPEG surrounding coding method that provides multichannel, consumers may experience not only high quality sound but also live and vivid multichannel sound. Recently, HE-AAC that is included in Dolby Pulse and MS10 is widely being used as a home audio coding method. The above-described sound coding methods all use QMF-based sub-band coding technique. Since a human's hearing system recognizes sound based on a frequency of an audio signal, the QMF-based sub-band coding technique is very effective in compression of audio and sound signals. However, the QMF-based sub-band coding requires a burden of a considerable amount of calculation to achieve its effectiveness.

SUMMARY

One or more embodiments disclosed herein include a method and apparatus for reducing the complexity of quadrature mirror filter (QMF) filtering and quickly performing QMF filtering.

Additional aspects will be set forth in part in the description which follows and, in part, will be apparent from the description, or may be learned by practice of the disclosed embodiments.

According to one or more embodiments of the disclosure, a method of performing quadrature mirror filter (QMF) synthesis filtering may include recording new samples corresponding to a current time slot at positions of samples to be discarded in a first array that comprises modulated QMF sub-band samples, extracting samples from the first array to remove aliasing between adjacent sub-bands, determining filter coefficients corresponding to extracted samples by using modulo operation, and synthesizing a time domain sample where aliasing is removed by using the extracted samples and the filter coefficients.

Recording positions of the new samples corresponding to the current time slot may be determined by modulo-operating sample recording positions in a previous time slot. New samples may be recorded at positions offset from the sample recording position in a previous time slot by N-number of the new samples. When the sample recording position in the previous time slot is a start of the first array, the new samples may be recorded from a last N-th position of the first array. Recording of the new samples in the first array may include generating N-number of real-number samples corresponding to K-number of sub-bands by inversely transforming K-number of complex sub-band samples that are transformed to a baseband, and recording the N-number of real-number samples at the positions of the samples to be discarded.

Positions of the samples to be extracted may be determined according to whether the current time slot is an even number or an odd number. Positions of the samples extracted from the first array when the current time slot is an even number, and positions of the samples extracted from the first array when the current time slot is an odd number, may be mutually exclusive. When the first array is divided into a plurality of sections, with respect to a natural number n, samples may be extracted in (4n−3)th and 4n-th sections when the current time slot is an even number and samples may be extracted in (4n−2)th and (4n−1)th sections when the current time slot is an odd number.

The determining of the filter coefficients may include performing a modulo operation by using the current time slot and a degree of a synthesis filter, and selecting the filter coefficients from a second array based on a result of the modulo operation. An identical filter coefficient may be recorded twice in the second array and positions where the identical filter coefficient is recorded may be separated from each other by a degree of the synthesis filter. Positions of filter coefficients selected from the second array may be shifted by 1 from the positions of the filter coefficients selected from a previous time slot.

The time domain sample may be synthesized by accumulating results of multiplications of the extracted samples and the determined filter coefficients. Recording, extracting, determining, and synthesizing may be recursively performed according to a change in the time slot.

According to one or more embodiments of the disclosure, a method of performing quadrature mirror filter (QMF) synthesis filtering may include recording new samples in a first array by circulating sample recording positions in the first array according to a change in a time slot, determining positions of samples to be extracted from the first array considering the circulation of the sample recording positions, and synthesizing a time domain sample with respect to a current time slot based on samples extracted at the determined positions.

The recording of the new samples in the first array may include determining whether a position of a leading sample of N-number of samples recorded in the first array in a previous time slot is a start of the first array, and if the position of the leading sample in the previous time slot is the start of the first array, recording the new samples from an N-th position of a last position of the first array. If the position of the leading sample in the previous time slot is not the start of the first array, the new samples may be recorded from a position decreased by N from the position of the leading sample.

In the determining of the positions of the samples to be extracted from the first array, the positions are determined such that samples are extracted from positions other than the positions where the samples are extracted in a previous time slot. In the determining of the positions of the samples to be extracted from the first array, the positions of the samples to be extracted may be determined according to whether the current time slot is an even number or an odd number.

The method may further include selecting coefficients corresponding to the samples extracted from a second array where filter coefficients are recorded. In each of M-number of groups obtained by dividing the extracted samples by a predetermined interval, a first filter coefficient and a second filter coefficient respectively corresponding to an n-th sample and an (n+1)th sample may be separated by 2M from each other in the second array. In the selecting of the coefficients in the second array, a coefficient to an n-th sample of an m-th group of the M-number of groups may be selected at a position obtained by summing $2*M*(n-1)+m-1$ and a remainder of dividing a current time slot by M.

According to one or more embodiments of the disclosure, a method of performing quadrature mirror filter (QMF) synthesis filtering may include recording modulated sub-band samples in a recording section having a size of N that circulates in a first array having a size of M*N according to a change in a time slot, selecting a predetermined (e.g., M*N/2) number of filter coefficients in a second array having a size of M*N where each of a predetermined (e.g., N) number of coefficient groups having consecutive M-number of filter coefficients as one group is consecutively recorded twice, and synthesizing a time domain sample with respect to a current time slot by using the predetermined (e.g., M*N/2) number of samples extracted from the first array and the (e.g., M*N/2) number of filter coefficients selected from in the second array. M and N may be a positive number or integer, greater than zero, for example. For example, M and N may be a counting number.

M may correspond to a degree of a synthesis filter and N may be double the number of QMF sub-bands.

In the recording of the modulated sub-band samples, if a position i of a leading sample of the samples recorded in the first array in a previous time slot is 0, the modulated sub-band samples may be recorded from a position [(M−1*N)], and if the position i of the leading sample of the samples recorded in the first array in the previous time slot is not 0, the modulated sub-band samples may be recorded from a position [i−N].

In the selecting of the filter coefficients, the filter coefficients may be selected at a position [m+2*M*n+MOD(I,M)] of the second array, where m is an integer greater than or equal to 0 and less than M, n is an integer greater than or equal to 0 and less than N/2, 1 is the current time slot, and MOD is a modulo operation.

The method may further include extracting (M*N/2) number of samples from the first array, wherein, if the current time slot is an odd number, the (M*N/2) number of samples may be extracted at a position [2*N*n+k+N/2] of the first array, where k is an integer greater than or equal to 0 and less than N, and n is an integer greater than or equal to 0 and less than N/2.

The method may further include extracting samples from the first array and storing the extracted samples in a third array, wherein the second array is twice the size of the third array and the first array.

According to one or more embodiments of the disclosure, a non-transitory computer readable recording medium may have recorded thereon one or more programs for executing any of the methods disclosed herein.

According to one or more embodiments of the disclosure, an apparatus for performing quadrature mirror filter (QMF) synthesis filtering may include a memory storing a first array where modulated samples of a sub-band signal are recorded and a second array where filter coefficients are recorded, a modulation unit (modulator) modulating samples of a sub-band signal to k-number of sub-bands in a baseband and storing the modulated samples in the first array, and a synthesis filter extracting samples from the first array to remove aliasing between adjacent sub-bands, selecting from a second array filter coefficients corresponding to extracted samples by using a modulo operation, and synthesizing a time domain sample by using the extracted samples and selected filter coefficients, in which the modulation unit records new samples modulated corresponding to a current time slot by circulating sample recording positions in the first array according to a change in a time slot.

The synthesis filter may determine positions of samples to be extracted from the first array according to whether the current time slot is an even number or an odd number. An identical filter coefficient may be recorded twice in the second array, and positions where the identical filter coefficient are recorded may be separated from each other by a degree of the synthesis filter. The apparatus may further include a decoder that decodes an encoded multichannel bitstream and outputs a signal of the sub-band.

According to one or more embodiments of the disclosure, a method of performing quadrature mirror filter (QMF) synthesis filtering may include recording, at positions of a first section of a first array of modulated QMF sub-band samples, new samples corresponding to a current time slot, the positions of the first section including samples which are to be discarded, extracting samples from the first array, determining filter coefficients corresponding to the extracted samples, and synthesizing a time domain sample by using the extracted samples and the filter coefficients. The new samples are recorded at the positions of the first section and the samples are discarded from the first section, for example, simultaneously, without shifting samples located in remaining sections of the first array which define the first array.

As a value of a time slot increases, new samples may be recorded in a second section of the first array, the second section being adjacent to a third section in which samples were recorded in a time slot previous to a time slot in which the new samples are recorded in the second section.

Samples may be extracted from the first array by selecting sections in a first time slot which are different from sections selected in a second time slot, from which to extract samples from the first array.

Filter coefficients may be determined for a first time slot by selecting filter coefficients from a first group of filter coefficients and for a second time slot following the first time slot by selecting filter coefficients from a second group of filter coefficients and selecting a portion of filter coefficients from the first group of filter coefficients. The first group of filter coefficients and second group of filter coefficients may be identical.

BRIEF DESCRIPTION OF THE DRAWINGS

These and/or other aspects will become apparent and more readily appreciated from the following description of the embodiments, taken in conjunction with the accompanying drawings in which:

FIG. 5 describes filter coefficients and samples extracted according to the algorithm of FIG. 4;

FIG. 12 describes filter coefficients and samples extracted according to an embodiment of the disclosure;

DETAILED DESCRIPTION

Figure 1:
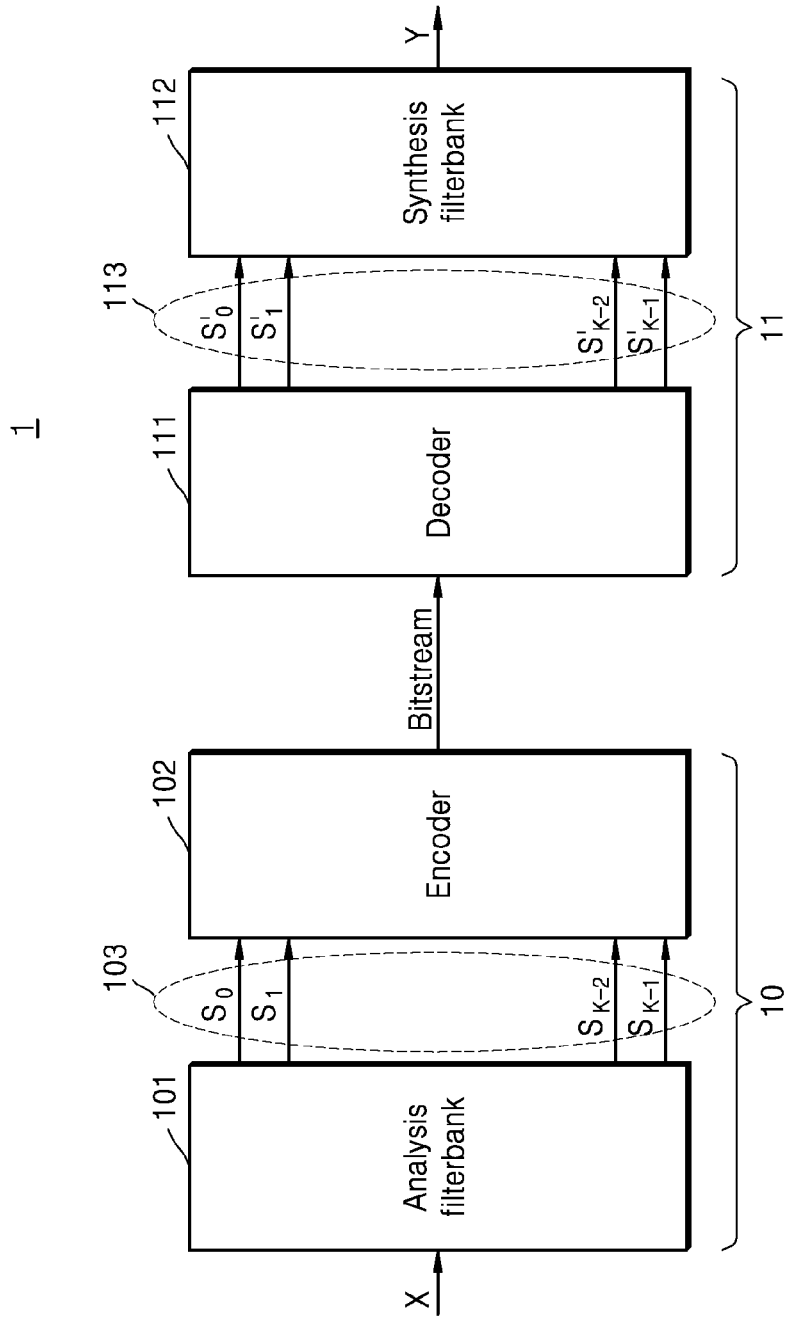
FIG. 1 illustrates a QMF filtering system according to an embodiment of the disclosure.

Reference will now be made in detail to embodiments, examples of which are illustrated in the accompanying drawings, wherein like reference numerals refer to like elements throughout. In this regard, the disclosed embodiments may have different forms and should not be construed as being limited to the descriptions set forth herein. Accordingly, the embodiments are merely described below, by referring to the figures, to explain aspects of the disclosure. As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a QMF filtering system 1 according to an embodiment of the disclosure. Referring to FIG. 1, the QMF filtering system 1 may include an analysis filter bank 101, an encoder 102, a decoder 111, and a synthesis filter bank 112. The analysis filter bank 101 and the encoder 102 constitute an analysis filtering device 10, whereas the decoder 111 and the synthesis filter bank 112 constitute a synthesis filtering device 11. The analysis filtering device 10 and the synthesis filtering device 11 may be independent devices.

The analysis filter bank 101 may perform analysis filtering on a voice signal X of an input time domain and outputs K-number of sub-band signals $S_{0-K-1}$ 103. The encoder 102 may encode one or more of the sub-band signals $S_{0-K-1}$ and output a bitstream. In doing so, an encoding method may be used in which resources are efficiently allotted such that a band signal in a high frequency range that is relatively less sensitive to a human ear is expressed by a relatively small number of bits and a band signal in a low frequency range that is relatively very sensitive to the human ear is expressed by a relatively large number of bits, thereby reducing the number of encoded bits.

The decoder 111 may receive the encoded bitstream and perform a reverse process of an encoding process, and thus generate sub-band signals $S'_{0-K-1}$ 113 that are very similar to the sub-band signals $S_{0-K-1}$ before being encoded. The reason for the sub-band signals $S_{0-K-1}$ and the signals $S'_{0-K-1}$ not being identical is that the sub-band signals $S_{0-K-1}$ are compressed by removing signal components that are not important to a human hearing system in the encoding process by the encoder 102. The synthesis filter bank 112 may perform synthesis filtering on each of the sub-band signals $S'_{0-K-1}$ to transform each of the sub-band signals $S'_{0-K-1}$ to a signal Y of a time domain that may be heard by a human. The encoder 102 and the decoder 111 may employ a variety of methods according to the type of codecs implemented. In the following description, a QMF analysis or synthesis filtering process will be mainly discussed.

Figure 2:
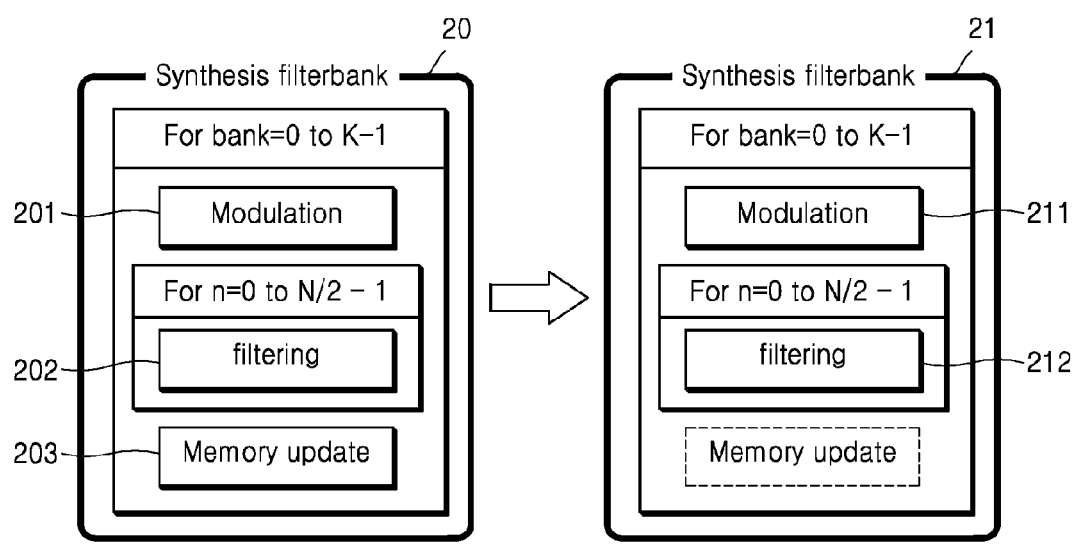
FIG. 2 schematically illustrates a comparison between a QMF synthesis filtering method according to an embodiment of the disclosure and a conventional method.

FIG. 2 schematically illustrates a comparison between a QMF synthesis filtering method according to an embodiment of the disclosure and a conventional method. Since FIG. 2 schematically illustrates a concept for comparison with the conventional method, detailed embodiments of the disclosure may be understood by referring to the following descriptions.

A synthesis filter bank 20 at the left illustrates a conventional synthesis filtering method, whereas a synthesis filter bank 21 at the right illustrates a synthesis filtering method according to an embodiment of the disclosure. In the synthesis filtering method according to the synthesis filter bank 20, modulation 201, filtering 202, and memory update 203 may be recursively performed.

In the synthesis filtering method according to the synthesis filter bank 21 in the right according to an embodiment of the disclosure, although modulation 211 and the filtering 212 are recursively performed, memory update may not be performed. In order to omit the memory update, the modulation 201 and the filtering 202 may be newly defined to be the modulation 211 and the filtering 212, which will be described below in detail. To check an amount of calculation according to the memory update 203 in the conventional synthesis filtering method, an operation of the convention synthesis filter bank 20 is first discussed below.

In a process of the modulation 201, each of the sub-band signals $S'_{0-K-1}$ that is transformed to a baseband is band-shifted to the original frequency band. A modulated sample of each of the sub-band signals $S'_{0-K-1}$ is recorded in a sample array V that may be expressed by Equation 1.

$$V[n] = \sum_{k=0}^{K-1} S'_{k,l} \cdot f_{k,n}, \qquad \text{[Equation 1]}$$

$$0 \le n < N$$

In Equation 1, K denotes the total number of sub-bands, l denotes a time slot index, n denotes a sample number, N denotes the total number of newly modulated samples with respect to the time slot l, and $S'_{k,l}$ denotes a sub-band sample of the time slot l in the k sub-band signal. For example, N may equal K×2. To prevent confusion in terminology, it is defined that the terms "sub-band sample", "sub-sample", or "sample of sub-band signal" are all indicated by $S'_{k,l}$, and the term "sample" signifies or corresponds to a sub-band sample V[n] that is modulated according to Equation 1. Unless defined otherwise, the above variables are used in the same way in the following descriptions.

$f_{k,n}$ is an inverse discrete cosine transform (IDCT) function and a variety of methods may be used according to the type of codecs. For example, $f_{k,n}$ may be expressed by Equation 2.

$$f_{k,n} = \frac{1}{K} \cdot \exp\left(\frac{i \cdot \pi \cdot (k + 0.5) \cdot (2n - 2N - 1)}{2K}\right) \quad \text{[Equation 2]}$$

The filtering 202 may signify or correspond to band pass filtering that removes aliasing between adjacent sub-bands in the sample array V while leaving a k sub-band signal only. The band pass filtering may be defined by Equations 3 and 4.

$$g[Nn + k] = \begin{cases} V[2Nn + k], & \text{where } 0 \le k < N/2 \\ V[2Nn + k + N], & \text{where } N/2 \le k < N \end{cases} \quad \text{[Equation 3]}$$

Equation 3 signifies or corresponds to a process of extracting a sample from the sample array V. When N/2-number of samples in the sample array V is one group, N-number of samples are extracted from the first to fourth sample groups according to Equation 3. Samples are extracted from other sample groups of the sample array V in a similar manner to Equation 3. The samples extracted from the sample array V are recorded in an extraction array g.

$$y_l[n] = \sum_{m=0}^{M-1} g[Nm/2 + n] \cdot c[m + Mn], \quad \text{[Equation 4]}$$
$$\text{where } 0 \le n < N/2$$

Equation 4 signifies or corresponds to a process of accumulating results of additions of the extracted samples and filter coefficients and synthesizing a time domain sample with respect to the time slot l. In Equation 4, c denotes a filter coefficient array that stores filter coefficients. The filter coefficient may be referred to as a window coefficient. M denotes a degree of the filtering 202. For example, the filtering 202 may be performed by using a finite impulse response (FIR) filter and M may denote a degree of the FIR filter. When N is 128, a total 64 of time domain samples may be synthesized. A result of synthesis is stored in the array y.

When the filtering 202 with respect to the time slot l is completed, the memory update 203 is performed to perform the modulation 201 and the filtering 202 with respect to a next time slot l+1. The memory update 203 may be defined by Equation 5.

$$V[n] = V[n-N], \text{ where } N \le n < N \cdot M \quad \text{[Equation 5]}$$

According to Equation 5, N*(M−1) number of samples are shifted by N in the sample array V. Here, a sign "*" denotes a multiplication operation. Read and write is each performed one time for one-time shifting of one sample. According to the memory update 203, samples recorded at positions [(M−1)N] to [MN−1] before update are discarded and samples recorded at positions [(M−2)N] to [(M−1)N−1] are shifted to the positions of the discarded samples. In the following descriptions, for convenience, the positions [0] to [N] are indicated to be [0~N].

When the memory update 203 is completed, the modulation 201 and the filtering 202 are recursively performed with respect to the next time slot l+1.

Figure 3:
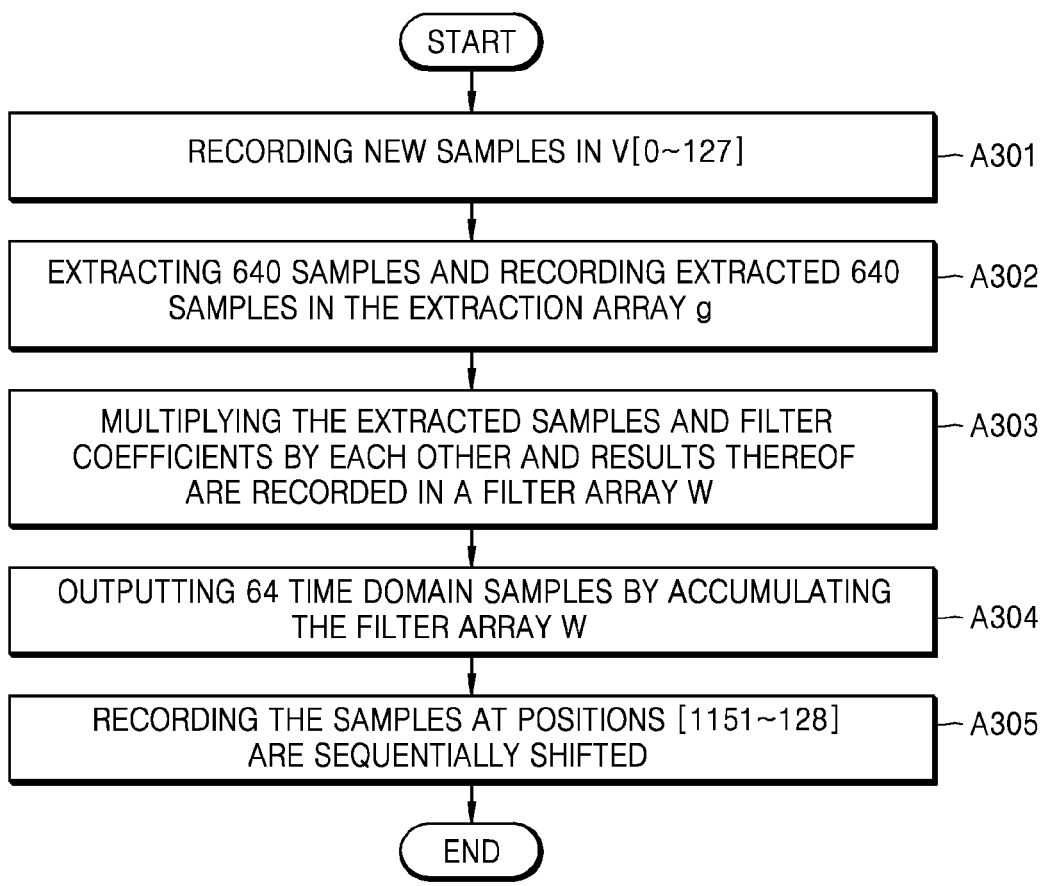
FIG. 3 is a flowchart for explaining a QMF synthesis filtering algorithm.

FIG. 3 is a flowchart for explaining a QMF synthesis filtering algorithm. FIG. 3 illustrates a QMF synthesis filtering algorithm when a degree of a filter is 10 (M=10) and the numbers of sub-bands are 64 and the number of new samples are 128 (K=64, where N=2*K=128). Referring to FIG. 3, operations A301, A302-A304, and A305 respectively denote the modulation 201, the filtering 202, and the memory update 203.

In operation A301, new samples are recorded in V[0~127]. X[k][l] corresponds to $S'_{k,l}$ of Equation 1. In other words, a sub-band sample X[k][l] signifies a sample to the l-th time slot of the k-th sub-band signal. In operation A301, new samples are generated by modulating X[k][l] and recorded in V[0~127].

Figure 4:
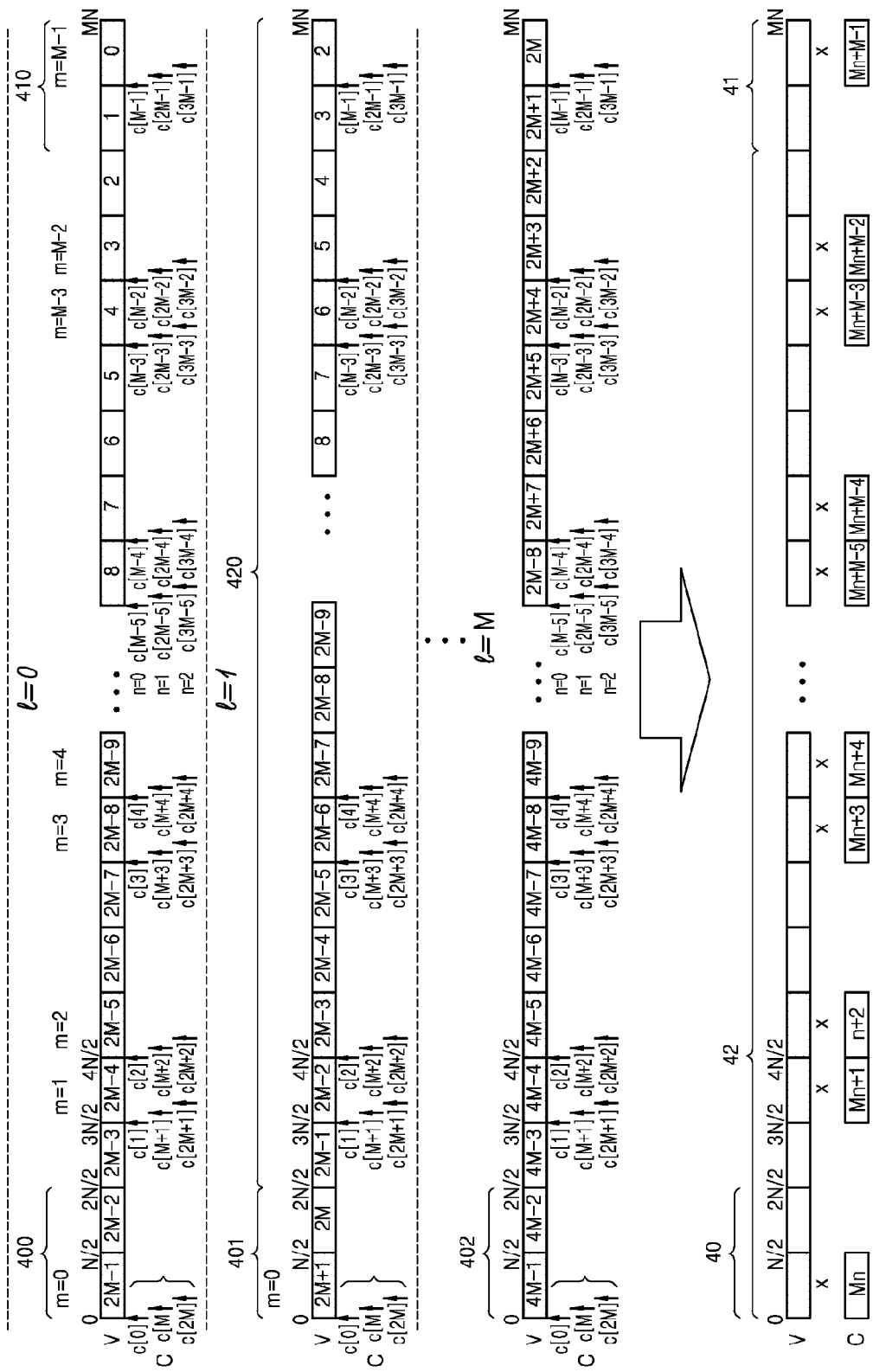
FIG. 4 describes a process of recording a sample array.

In a section where new samples are recorded in operation A301 with reference to FIG. 4, when l=0, new samples are recorded in a section 400. When l=1, new samples are recorded in a section 401, and when l=M, new samples are recorded in a section 402. Accordingly, new samples are always recorded in V[0~127].

As illustrated in FIG. 4, according to a conventional technology, in the sample array V, a section 40 where new samples are recorded and a section 41 (see also section 410) where existing samples are discarded are always maintained regardless of a change of a time slot. This is because the samples existing in the section 42 (see also section 420) are shifted by N.

In operation A302, six hundred and forty (640) samples are extracted and recorded in the extraction array g. The operation A302 is a process corresponding to Equation 3.

Referring to FIG. 4, samples extracted from the sample array V are illustrated by shading. In other words, when l=0, M-number (e.g., ten) of sample groups $V_{2M-1}$, $V_{2M-4}$, $V_{2M-5}$, $V_{2M-8}$, $V_{2M-9}$, $V_4$, $V_3$, and $V_0$ are extracted. Each sample group includes 64 samples. Also, when l=1, M-number of sample groups $V_{2M+1}$, $V_{2M-2}$, $V_{2M-3}$, $V_{2M-6}$, $V_{2M-7}$, ..., $V_6$, $V_5$, and $V_2$ are extracted. Consequently, when the time slot is changed, values of the extracted samples are changed, but the positions [0~N/2−1][3N/2~5N/2−1]...[MN−N/2~MN−1] of the extracted samples are not changed. Accordingly, samples are always extracted in the same section regardless of the time slot.

In operation A303, the extracted samples and filter coefficients are multiplied by each other and results thereof are recorded in a filter array w. In operation A304, sixty four (64) time domain samples are output by accumulating the filter array w. The operations A303 and A304 are processes corresponding to Equation 4.

The operations A303 and A304 are discussed with reference to FIGS. 4 and 5. FIG. 5 exemplarily illustrates a result of Equation 4. FIG. 5 illustrates part of a result of Equation 4 starting from (l=0, n=0, m=0) to (l=0, n=0, m=1) ... (l=0, n=0, m=9), (l=0, n=1, m=0), (l=0, n=1, m=1) ... (l=0, n=63, m=9), and (l=1, n=0, m=0), in order. For example, in Equation 4, m may be a variable of the lowermost routine and l may be a variable of the uppermost routine. Equation 4 may be easily understood by referring to FIG. 5, in which the position of a filter coefficient increases by +1 according to m when n is identical. Also, the filter coefficient increases by +M according to an increase in n when m is identical. As can be seen, a change in the time slot l does not affect the position of the filter coefficient.

The result shown in FIG. 5 is described with reference to FIG. 4. The shaded coefficient groups are samples extracted from the sample array V and signify the extraction array g in Equation 4. Arrows in FIG. 4 indicate filter coefficients. A movement of the arrow in the horizontal direction at the same height denotes a change in the value m. Also, a movement of the arrow in the vertical direction denotes a change in the value n. It can be seen that the positions of the filter coefficients multiplied by the extracted samples are maintained without a change in spite of a change in the time slots from l=0 to l=M.

In operation A305, the samples recorded at positions [1151~128] are sequentially shifted. Referring to FIG. 4, as the time slot is changed from l=0 to l=1, two sample groups $V_0$ and $V_1$ existing in the sample array V[(M−1)N~MN−1] are discarded. According to the shifting, two sample groups $V_2$ and $V_3$ existing in V[(M−2)N~(M−1)N−1] are recorded in V[(M−1)N~MN−1].

According to the operation A305, the positions of the discarded samples are always fixed to be constant with respect to all time slot changes. In other words, the samples located in [(M−1)N~MN−1] are always discarded.

According to the operation A305, (M−1)N times of memory reads and writes are performed to shaft (M−1)N-number of samples. For example, when read and write are respectively performed at 4 cycles and 6 cycles in a processor, the above process is performed at 10(M−1)N cycles. For an actual standard codec such as HE-AAC v2, Dolby Pulse, or MS10 DDT, since M is 10 and N is 128, the cycle for the memory update process for each channel is 368640 (10*9*128*32), Accordingly, a minimum of 17 Mcycle is needed for a case of stereo and 51.84 Mcycle is needed for a case of 5.1 surround channel. To see a rate of the above calculation amount to the total calculation amount, for a decoder of HE-AAC v2, for example, a cycle for the memory update of a filter takes about 32% of the total calculation amount and about 55% in the QMF filtering process only.

As described below, a modulo addressing method is used for storing input data in a memory so that the memory update process may be omitted in the disclosed embodiments, and also, the filtering process is reconfigured or modified to accommodate the above method so that complexity in the memory update is removed.

Figure 6:
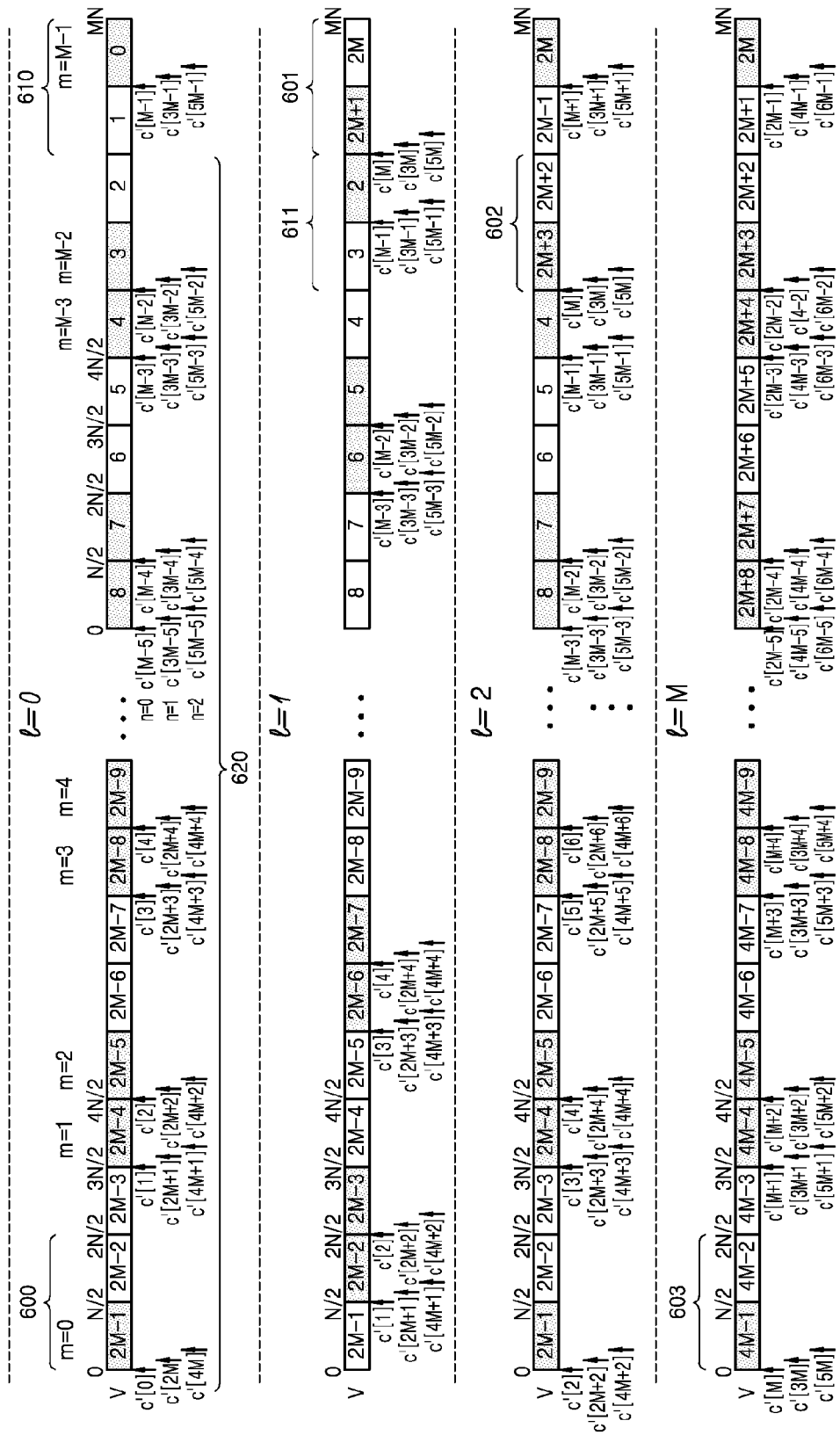
FIG. 6 describes a QMF synthesis filtering method according to an embodiment of the disclosure.

FIG. 6 describes a QMF synthesis filtering method according to an embodiment of the disclosure. Unless mentioned otherwise, the embodiments of synthesis filtering methods described below may be understood as the operation of the synthesis filtering device 11 according to an embodiment of the disclosure.

First, when the time slot l is 0 (l=0), N-number of new samples corresponding to the time slot l that is 0 (l=0) are recorded in the section 600 of the sample array V. When the time slot l is changed to 1 (l=1), samples located in a section 610 are discarded and simultaneously N-number of new samples are recorded at section 601 which corresponds to section 610 and occupies the same positions of the discarded samples. In other words, the sample groups $V_{0,1}$ located at the positions [M(N−1)~MN−1] are discarded and simultaneously the sample groups $V_{2M,2M+1}$ are recorded at the positions [M(N−1)~MN−1]. Accordingly, it may be understood that the discarded samples are replaced with new samples corresponding to the current time slot l that is 1 (l=1) according to the time slot change. In other words, new samples corresponding to the current time slot are recorded at the positions of the discarded samples in an overwrite method. Unlike the conventional method, in the present embodiment, the samples located in a section 620 are not shifted. When the sample arrays V at l=0 and l=1 are compared with each other, it may be seen that the sample groups $V_2$ to $V_{2M-1}$ are maintained without a change.

In the example embodiment, since new samples are recorded without shifting of samples, the memory update 203 according to Equation 5 and the operation 305 may be omitted.

When the time slot l is 2 (l=2), the sample groups $V_{2,3}$ existing in a section 611 are discarded and simultaneously sample groups $V_{2M+2,\ 2M+3}$ are recorded. When the time slot l is M (l=M), the sample groups existing in a section 603 are discarded and simultaneously sample groups $V_{4M-1,\ 4M-2}$ are recorded at section 602 which corresponds to section 611.

According to a sample recording method according to the example embodiment, sample recording sections in the sample array V are circulated according to a change in the time slot. Since the recording sections are circulated, the sample array V of the disclosure operates similarly to a circular array 80 of FIG. 8.

Figure 8:
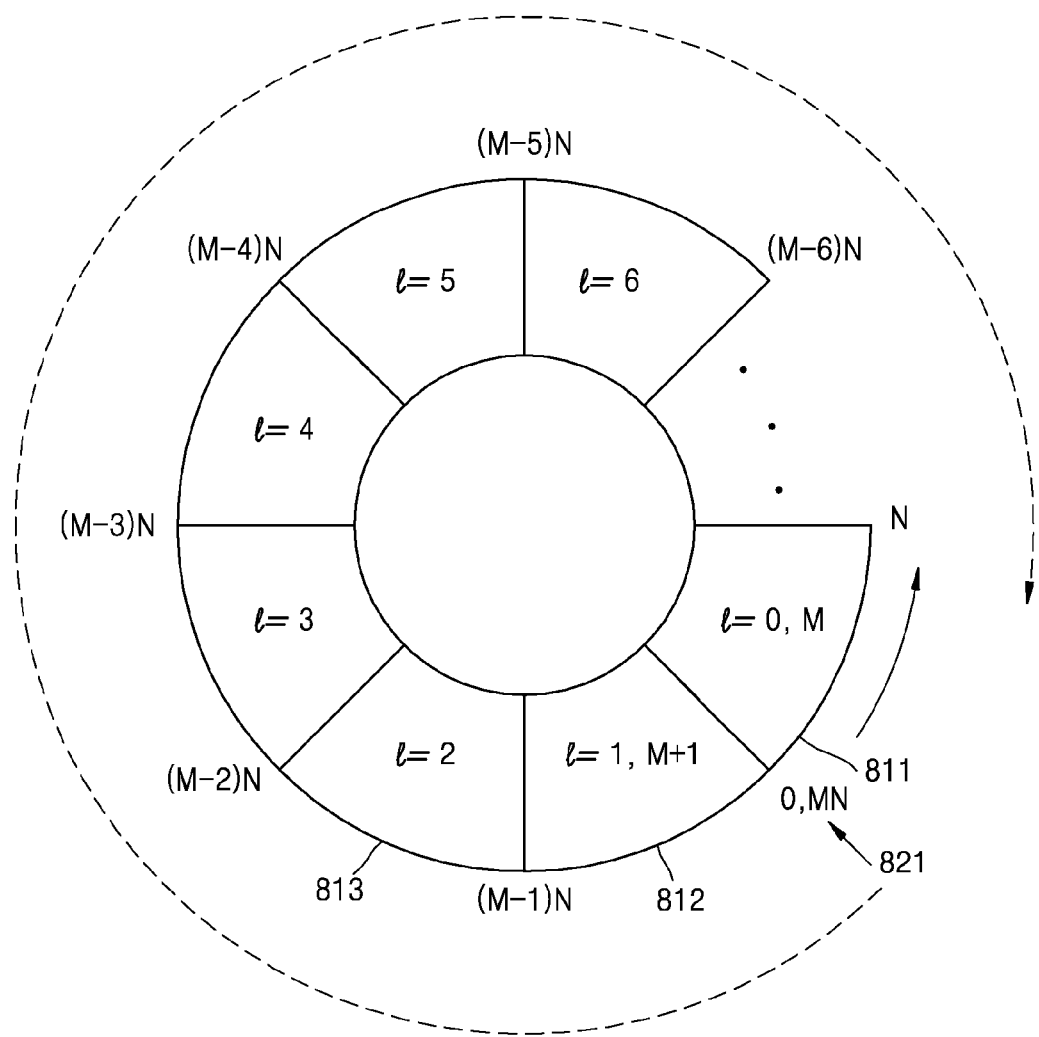
FIG. 8 describes a process of recording a sample array according to an embodiment of the disclosure.

Referring to the circular array 80 of FIG. 8, the size of the circular array 80 corresponds to MN and may be divided into a total M-number of sections (e.g., ten). The size of each section is N (e.g., 128). A start position [0] and a last position [MN] (e.g., 1280) of the circular array 80 are regarded to be the same position. When the time slot l is 0 (l=0), N-number of samples are recorded in a section 811. When the time slot l is 1 (l=1), N-number of samples are recorded in a section 812. When the time slot l is 2 (l=2), N-number of samples are recorded in a section 813. Accordingly, as the time slot is changed, the recording section is circulated in a direction indicated by a dashed line. In the example embodiment, a recording position of a leading sample may be used for a method of identifying a recording section. The leading sample refers to a sample that is first recorded among the samples recorded in one recording section. For example, when l=0, the recording position of a leading sample 821 is [0] and (N−1) number of samples (e.g., 127) following the leading sample 821 are sequentially recorded in recording positions [1~N−1], (e.g, 0, then 1, 2, 3 to 127). The direction in which the samples are recorded is indicated by the arrow that is indicated by a solid line. Accordingly, the direction in which the recording position of the leading sample is circulated and the direction in which N-number of samples are recorded may be opposite to each other.

According to the example embodiment, the recording positions or recording sections of new samples corresponding to the current time slot may be determined according to modulo addressing. Similarly, the positions of samples to be discarded according to the change in the time slot may be determined according to modulo addressing. This is because the positions of the samples to be discarded and the positions of the new samples are circulated according to the change in the time slot.

A recording position $i_l$ of the leading sample among new samples to be recorded in a current time slot may be expressed by Equation 6.

$$i_l = \begin{cases} i_{l-1} - N, & i_{l-1} \neq 0 \\ (M-1)N, & i_{l-1} = 0 \end{cases} \qquad \text{[Equation 6]}$$

$i_{l-1}$ is a recording position of the leading sample among samples recorded in a previous time slot. Although Equation 6 expresses the recording position $i_l$ of the leading sample as a branching statement, this substantially refers to modulo addressing. In other words, this is because, when the recording position $i_l$ with respect to a previous time slot is the start position [0] of the sample array V, the recording position $i_l$ with respect to a current time slot goes back to the last N-th position. When the recording position with respect to the previous time slot is not the start position [0], N-number of new samples are recorded from a position that is decreased by N from the position $i_{l-1}$.

When Equation 6 is expressed by a modulo function, it can be expressed by Equation 7, but the disclosure is not limited thereto.

$$i_l = \text{MOD}(M - \text{MOD}(l, M), M) \times N \quad \text{[Equation 7]}$$
$$= \text{MOD}(MN - \text{MOD}(i_{l-1} + N, MN), MN)$$
$$= (M - 1 - \text{MOD}(l - 1, M)) \times N$$

The recording positions of new samples may be expressed by a method other than the recording position of a leading sample. For example, the recording positions of new samples may be expressed in a variety of methods using, for example, as the last sample, the n-th sample, start and end positions of a recording section, an identifier of a recording section, etc., which do not correspond to the leading sample.

The modulation process according to an example embodiment may be expressed by Equation 8.

$$V[i_l + n] = \sum_{k=0}^{K-1} S'_{k,l} \cdot f_{k,n}, \quad \text{[Equation 8]}$$

where $0 \leq n < N$

Referring to Equation 8, N-number of new samples may be sequentially recorded from a recording position $[i_l]$ determined by Equation 6 or 7. The new samples signify or correspond to the sub-band samples $S'_{k,l}$ that are modulated by the function of Equation 2. $S'_{k,l}$ may be complex sub-band samples for example. Also, only real numbers of the values calculated by Equation 8 may be stored in the sample array V. In other words, K-number of complex sub-band samples that are transformed to a baseband by Equations 2 and 8 are inversely transformed and N-number of real-number samples corresponding to the K-number of sub-bands are generated. The generated samples may be recorded in the sample array V by Equations 6, 7, and 8.

The samples of the sample array V may be extracted to remove aliasing. However, since the recording positions and order of the samples in the sample array V are changed, a conventional sample extraction method may not be applied to the example embodiment. According to the example embodiment, in the extracting of the samples from the sample array V, the samples are extracted in consideration of circulation of the sample recording positions according to the change in the time slot.

From a comparison of the shaded portions between the conventional method of FIG. 4 and the disclosed example embodiment of FIG. 6, it may be seen that, although the number of extracted sample groups in FIGS. 4 and 6 are the same, the order and the extraction position are different.

When the time slot l is 0 (l=0), the extraction order and positions of samples in FIGS. 4 and 6 are the same. However, when the time slot l is 1 to M−1 (l=1 to M−1), the extraction order and positions of samples in FIGS. 4 and 6 are quite different.

According to the example embodiment, the positions of the samples to be extracted from the sample array may be determined according to whether a current time slot is an odd number or an even number. In FIG. 6, the positions of samples extracted when the time slot is an even number and the positions of samples extracted when the time slot is an odd number are exclusive. The positions of the samples to be extracted are inversed whenever the time slot is changed.

When the sample array V is divided by an interval of N/2 of a sample, if a current time slot is an even number, samples may be extracted in the 1st, 4th, 5th, 8th, 9th, 12th, 13th, . . . , and 2M-th sections. If the current time slot is an odd number, samples may be extracted in the 2nd, 3rd, 6th, 7th, 10th, $11^{th}$, . . . , (2M−2)th, and (2M−1)th sections. In other words, when the current time slot is an even number, samples may be extracted in the (4n−3)th and 4n-th sections. When the current time slot is an odd number, samples may be extracted in the (4n−2)th and (4n−1)th sections. n denotes a natural number less than or equal to M/2.

Equation 9 expresses a process of extracting samples according to the example embodiment.

$$\text{if, } l = \text{even;} \quad \text{[Equation 9]}$$
$$g[Nn + k] = \begin{cases} V[2Nn + k], & \text{where } 0 \leq k < N/2 \\ V[2Nn + k + N], & \text{where } N/2 \leq k < N \end{cases}$$

otherwise, $l = $ odd;

$$g[Nn + k] = V[2Nn + k + N/2],$$

where $0 \leq k < N$

Figure 9:
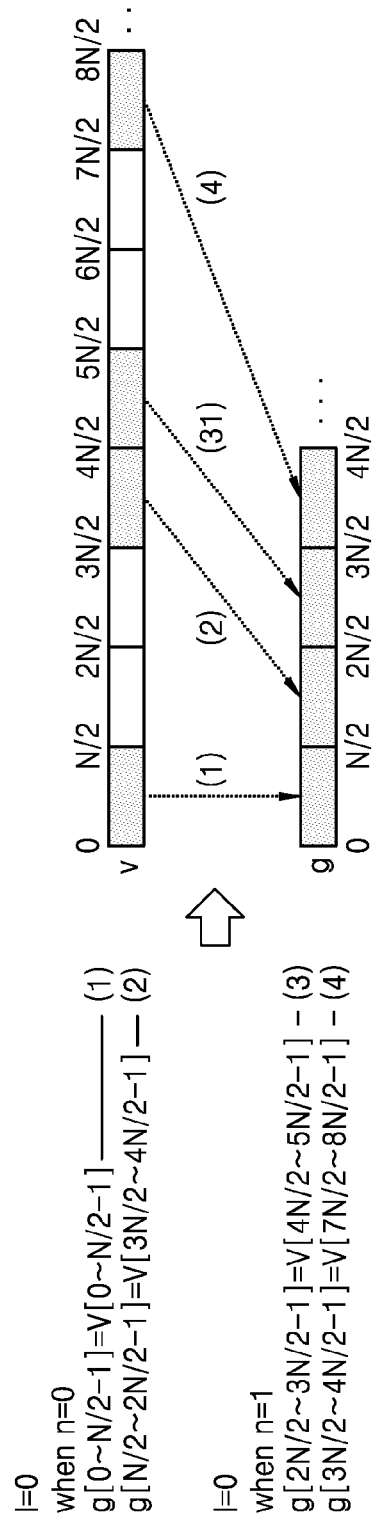
FIG. 9 describes a process of extracting a sample from a sample array according to an embodiment of the disclosure.

According to Equation 9, (M*N/2) number of samples are extracted from the sample array V. FIG. 12 illustrates a part of a result of the sample extraction according to Equation 9. FIG. 9 is reflects a relationship between the illustration of FIG. 6, Equation 9, and a result of FIG. 12. When a case of (l=0, n=1) is applied to Equation 9, (1) V[0~N/2−1], (2) V[3N/2~4N/2−1], (3) V[4N/2~5N/2−1], and (4) V[7N/2~8N/2−1] may be extracted from the sample array. As illustrated in FIG. 9, the extracted samples (1)~(4) may be sequentially recorded in the extraction array g.

When an extraction array according to the example embodiment is g1 and an extraction array according to a convention method is g2, except for a case in which the time slot is an integer multiple of M, g1[n]≈g2[n]. Accordingly, a filter coefficient that is multiplied to g1[n] is different from a filter coefficient that is multiplied to g2[n].

This is because the extraction array g1 is generated, unlike g2, in consideration of the circulation of sample recording positions of a sample array. Accordingly, according to the example embodiments, a filter coefficient array c' that records a filter coefficient corresponding to the extraction array g1 is defined by a new method that is different from a conventional filter coefficient array c.

Equation 10 may define the filter coefficient array c' according to an example embodiment.

$$c'[m+2Mn]=c'[m+2Mn+M]=c[m+Mn] \text{ where } 0 \leq n < N/2$$
$$\text{where } 0 \leq m < M \quad \text{[Equation 10]}$$

Figure 10:
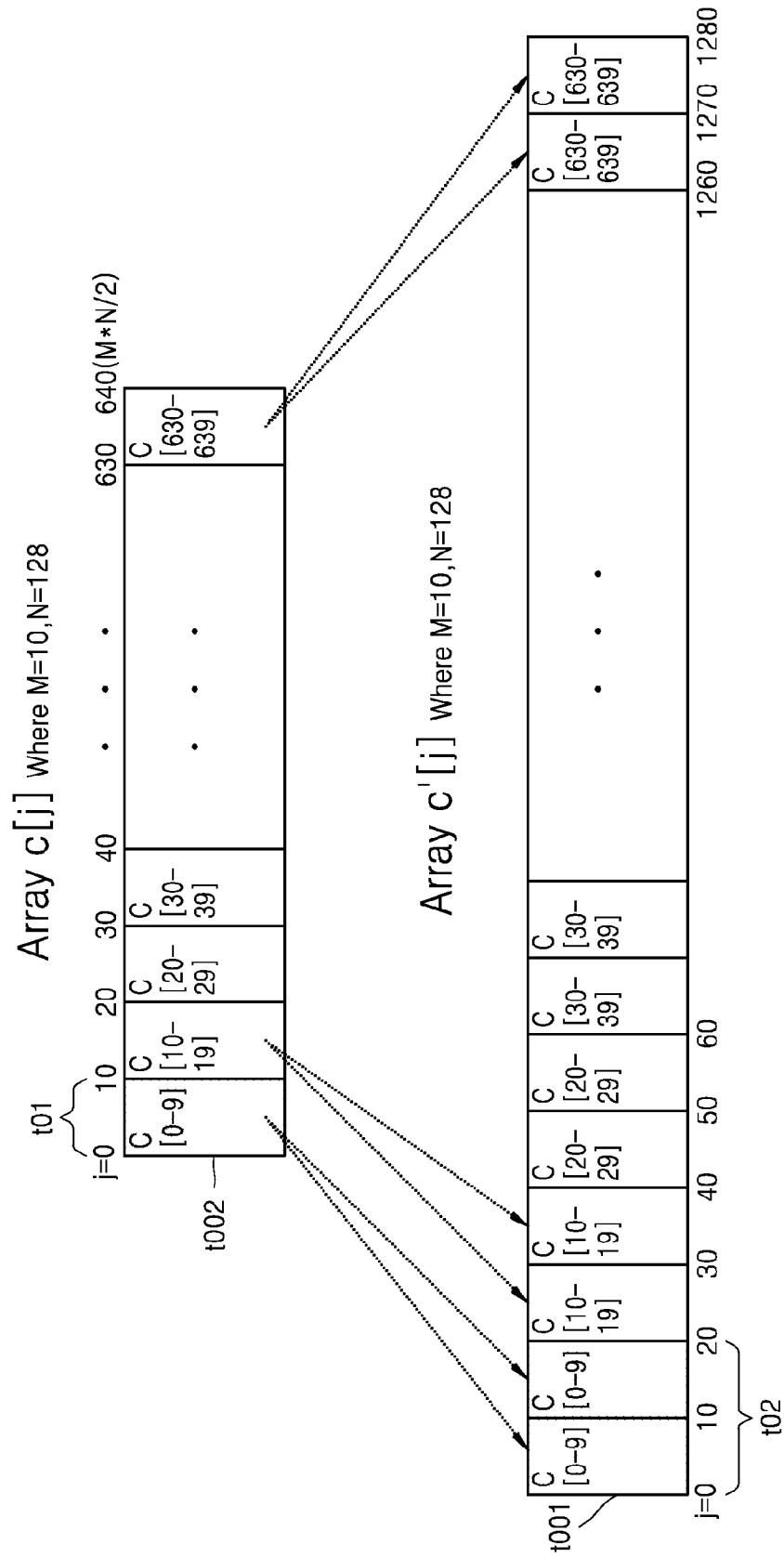
FIG. 10 illustrates a filter coefficient array according to an embodiment of the disclosure.

A filter coefficient array according to the example embodiment is described with reference to Equation 10 and FIG. 10. FIG. 10 illustrates both of a conventional filter coefficient array c(t002) and a filter coefficient array c'(t001) when M=10 and N=128.

The size of the filter coefficient array c(t002) may be the same as the size MN/2 of the extraction array g. However, the size of the filter coefficient array c'(t001) is MN, which is twice the size of each of the extraction g and the filter coefficient array c(t002).

The reason for the size of the filter coefficient array c'(t001) being double the size of the filter coefficient array c(t002) is that filter coefficients of the filter coefficient array c(t002) are recorded twice in the filter coefficient array c'(t001). Accordingly, an identical filter coefficient is recorded twice in the filter coefficient array c'(t001) and the positions for recording an identical filter coefficient are separated by a degree M of a synthesis filter.

When the filter coefficient array c(t002) is divided into N/2-number of filter coefficient groups, a first coefficient group (t01) is consecutively recorded twice (t02) in the filter coefficient array c'(t001). Likewise, groups from a second coefficient group to a last coefficient group are consecutively recorded twice in the filter coefficient array c'(t001), and so on.

According to the example embodiment, a filter coefficient corresponding to the extracted sample may be determined according to modulo addressing. Equation 11 expresses a method of selecting a filter coefficient according to modulo addressing.

$$c'[m+2Mn+\text{MOD}(l,M)] \text{ where } 0 \leq n < N/2 \text{ where } 0 \leq m < M-1 \quad [\text{Equation 11}]$$

According to Equation 11, a filter coefficient is selected at a position [m+2MN+MOD(I,M)] obtained by summing 2*M*(n−1)+m−1 and the remainder of dividing a current time slot by M. MOD(I,M) signifies or corresponds to a modulo operation using the degree M of a synthesis filter and the current time slot l.

Figure 11:
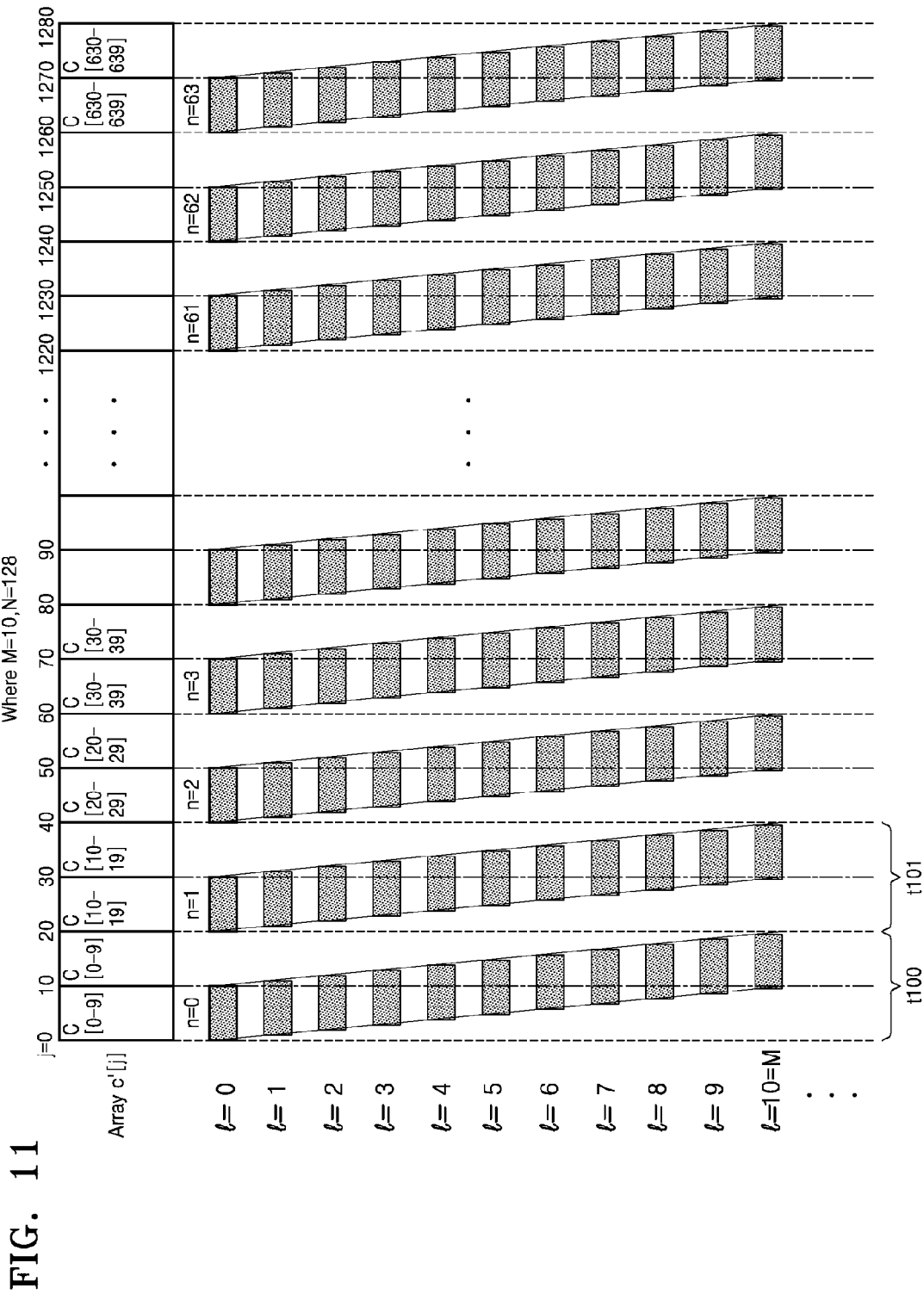
FIG. 11 describes a process of selecting a filter coefficient according to an embodiment of the disclosure.

FIG. 11 illustrates an example process of selecting a filter coefficient in the filter coefficient array c' when M=10 and N=128 in Equation 11. Referring to FIG. 11, when n=0, a filter coefficient is selected in a section t100 with respect to all time slots l. When n=1, a filter coefficient is selected in a section t101 with respect to all time slots l. However, as the time slot l increases by 1, the position of a selected filter coefficient increases by +1.

First, when l=0 and n=0, c'[0~9] is selected with respect to 0≤m<M. Here, C'[0~9]=c[0~9]. When n is increased by 1, c'[20~29] is selected with respect to 0≤m<M. In other words, when n is increased by 1, the position of a filter coefficient is increased by [2M]. This is because an identical filter coefficient is recorded twice at an interval M in the filter coefficient array c'. Here, c'[20~29]=c[10~19].

When l=0, a selected filter coefficient may be c[0~9], c[10~19], which is the same as the filter coefficient that is selected when l=0. This is because, when l=0, the recording positions and extraction positions of samples in the sample array V are the same as those according to the conventional method. However, as the time slot l is changed, in the disclosed embodiments, the recording positions and extraction positions of samples in the sample array V are changed different from those according to the conventional method and thus a different filter coefficient from the conventional method is selected.

When l=1 and n=0, c'[1~10] is selected with respect to 0≤m<M. Here, c'[1~9]=c[1~9] and c'[10]=c[0]. When n is increased by 1, c'[21~30] is selected with respect to 0≤m<M. Here, c'[21~29]=c[11~19] and c'[20]=c[10]. As illustrated in FIG. 4, according to the conventional method, filter coefficients are selected in order of c[0~9], c[10~19] . . . . According to the disclosed embodiments, the selection order of filter coefficients is changed to c[1~9], c[0], c[11~19], c[10] . . . . When l=2, the selection order of filter coefficients is c[2~9], c[0~1], c[12~19], c[10~11]. In other words, filter coefficients are selected at positions that are shifted by 1 from the positions of the filter coefficients selected in the previous time slot.

This is because, according to the disclosed embodiments, the selection positions of filter coefficients are circularly changed according to the modulo addressing as the recording positions and extraction positions of samples in the sample array V are circularly changed according to the modulo addressing.

Equation 12 expresses a process of synthesizing time domain samples by accumulating results of multiplication of a sample extracted by Equation 9 by a filter coefficient selected by Equation 11.

$$y_l[n] = \sum_{m=0}^{M-1} g[Nm/2 + n] \cdot c'[m + 2Mn + \text{MOD}(l, M)], \quad [\text{Equation 12}]$$

where $0 \leq n < N/2$

Referring back to FIG. 6, according to Equation 11, the positions of the extracted samples and the selected filter coefficients are illustrated.

When the time slot l=0 is changed to l=1, a sample is extracted at V[N/2] with respect to n=0 and m=0 and recorded in g[1] and then g[1] is multiplied by c'[1]. A sample is extracted at V[2N/2] with respect to n=0 and m=1 and recorded in g[N/2] and then g[N/2] is multiplied by c'[2]. An identical process may be repeated until n=0 and m=9 and then n is changed to 1 (n=1). A sample may be extracted at V[N/2+1] with respect to n=1 and m=0 and recorded in g[2] and then g[2] is multiplied by c'[2M+1]. When the identical process is repeated until n=64 and m=9, the time slot l is changed to 2 (l=2).

Figure 7:
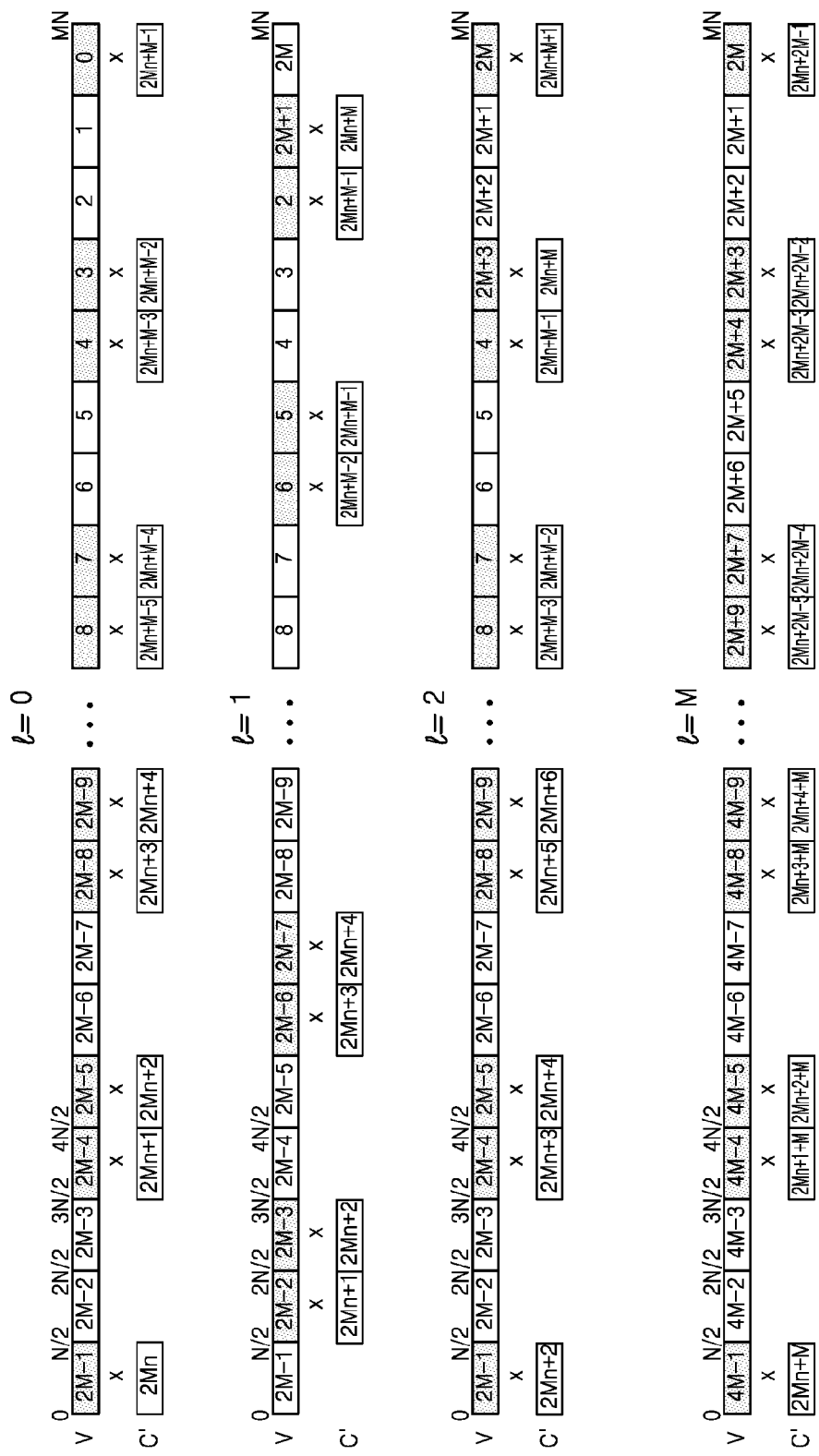
FIG. 7 describes a QMF synthesis filtering method according to an embodiment of the disclosure.

The generation of the filter coefficients with respect to a variable n in the synthesis filtering process illustrated in FIG. 6 may be illustrated as in FIG. 7. FIG. 7 intuitively illustrates that the positions of filter coefficients selected according to the change in the time slot are circulated.

The above descriptions describe a QMF synthesis filtering method performed in the synthesis filtering device 11 according to the example disclosed embodiments. At least a part of the above-described equations according to the disclosed embodiments may be embodied by a lookup table by being previously calculated as in FIG. 12. For example, at least a part of the information about the recording positions of the circulating samples, the positions of the extracted samples, and the positions of the selected filter coefficients, according to a change in the time slot, may be stored in the synthesis filtering device 11 as a lookup table and then used.

Figure 13:
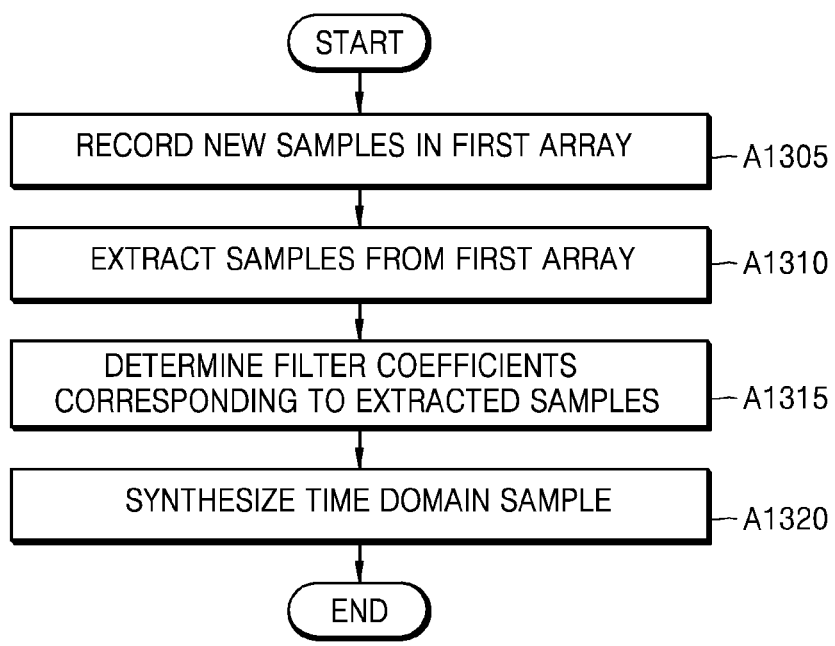
FIG. 13 is a flowchart for explaining a QMF synthesis filtering method according to an embodiment of the disclosure.

FIG. 13 is a flowchart for explaining a QMF synthesis filtering method according to an embodiment of the disclosure. Any redundant descriptions of the above-described embodiments will be omitted herein. Accordingly, the above-descriptions may be referred to without any special comments. In the following description, a first, second, and third array have the same meaning as (or correspond to) the sample array V, the filter coefficient array c', and the extraction array g, respectively.

Referring to FIG. 13, the synthesis filtering device 11 may record new samples in a first array (A1305). The synthesis filtering device 11 may record new samples corresponding to the current time slot l at the position of the samples to be discarded in the first array that includes the modulated QMF sub-band samples.

The synthesis filtering device 11 may record the new samples while circuiting the sample recording position $i_l$ in the first array according to a change in the time slot l. For example, the synthesis filtering device 11 may modulo-calculate a sample recording position $i_{l-1}$ in the previous time slot l−1 as shown by Equations 6 to 8 and determine the recording position $i_{l-1}$ $i_l$ of the new samples corresponding to the current time slot l.

According to Equation 6, the synthesis filtering device 11 may record the new samples at positions offset from the sample recording position in the previous time slot l−1 by the N-number of the new samples. However, when the sample recording position $i_{l-1}$ in the previous time slot l−1 is the start position [0] of the first array, the new samples are recorded from the last N-th position [(M−1)N] of the first array.

Figure 14:
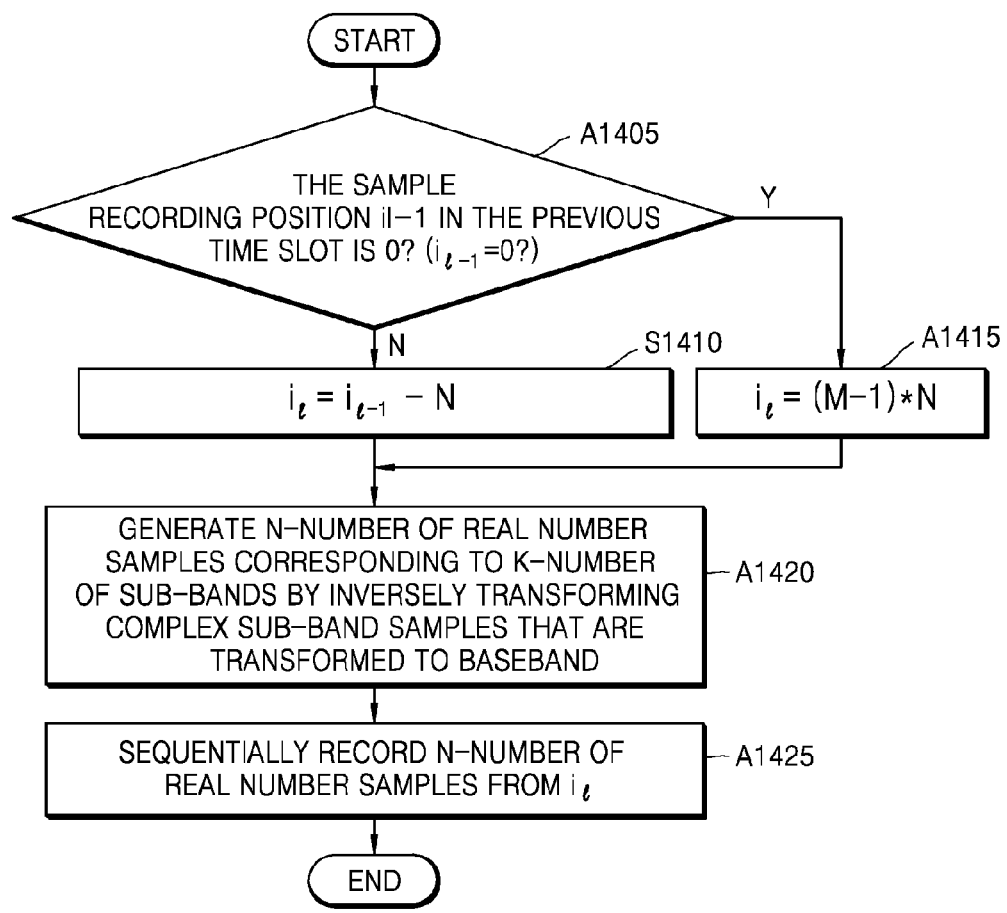
FIG. 14 is a flowchart for explaining a method of recording a sample array according to an embodiment of the disclosure.

The operation A1305 is described in detail below with reference to FIG. 14.

The synthesis filtering device 11 may determine whether the sample recording position $i_{l-1}$ is the start position [0] of the first array (A1405). According to an embodiment, $i_{l-1}$ may be a position of the leading sample of the N-number of samples recorded in the first array in the previous time slot l−1. The synthesis filtering device 11 may determine whether the position $i_{l-1}$ of the leading sample in the previous time slot is the start position [0] of the first array.

If the position $i_{l-1}$ of the leading sample in the previous time slot is the start position [0] of the first array, the synthesis filtering device 11 may update the sample recording position $i_l$ in the current time slot to (M−1)*N (that is, $i_l$=(M−1)*N) (A1415)

If the position $i_{l-1}$ of the leading sample in the previous time slot is not the start position [0] of the first array, the synthesis filtering device 11 may update the sample recording position $i_l$ in the current time slot to $i_{l-1}$−N (that is, $i_l$=$i_{l-1}$−N) (A1410)

According to Equation 8, the synthesis filtering device 11 may inversely transform the K-number of complex sub-band samples that are transformed to a baseband to generate N-number of real-number samples corresponding to the K-number of sub-bands (A1420). The synthesis filtering device 11 may record the N-number of real-number samples at the positions of the samples to be discarded (A1425). The operation A1420 may be performed earlier than the operation A1405. Alternatively, operation A1420 may be performed simultaneously with operation A1405, or after operation A1405.

As described above, when M corresponds to a degree of a synthesis filter and N corresponds to double the number of a QMF sub-band, the synthesis filtering device 11 may record the modulated sub-band samples in a recording section having a size of N that circulates according to a change in the time slot in the first array having a size of M*N.

Referring back to FIG. 13, the synthesis filtering device 11 may extract samples from the first array (A1310). Samples may be extracted to remove aliasing between adjacent sub-bands, for example. The synthesis filtering device 11 may determine the positions of the samples to be extracted from the first array by circulating the sample recording positions in the first array. The number of samples to be extracted may be M*N/2 that is half of the size of the first array.

The synthesis filtering device 11 may determine filter coefficients corresponding to the extracted samples (A1315). The synthesis filtering device 11 may determine filter coefficients by using modulo operation, for example. The synthesis filtering device 11 may select (M*N/2) number of filter coefficients in the second array having a size of M*N where each of N-number of coefficient groups having consecutive M-number of filter coefficients as one group is consecutively recorded twice.

The synthesis filtering device 11 may synthesize a time domain sample by using the extracted samples and filter coefficients (A1320). A synthesized time domain sample where aliasing is removed may be (N/2) number of samples corresponding to the current time slot. The synthesis filtering device 11 may perform the above-described operations recursively according to a change in the time slot.

Figure 15:
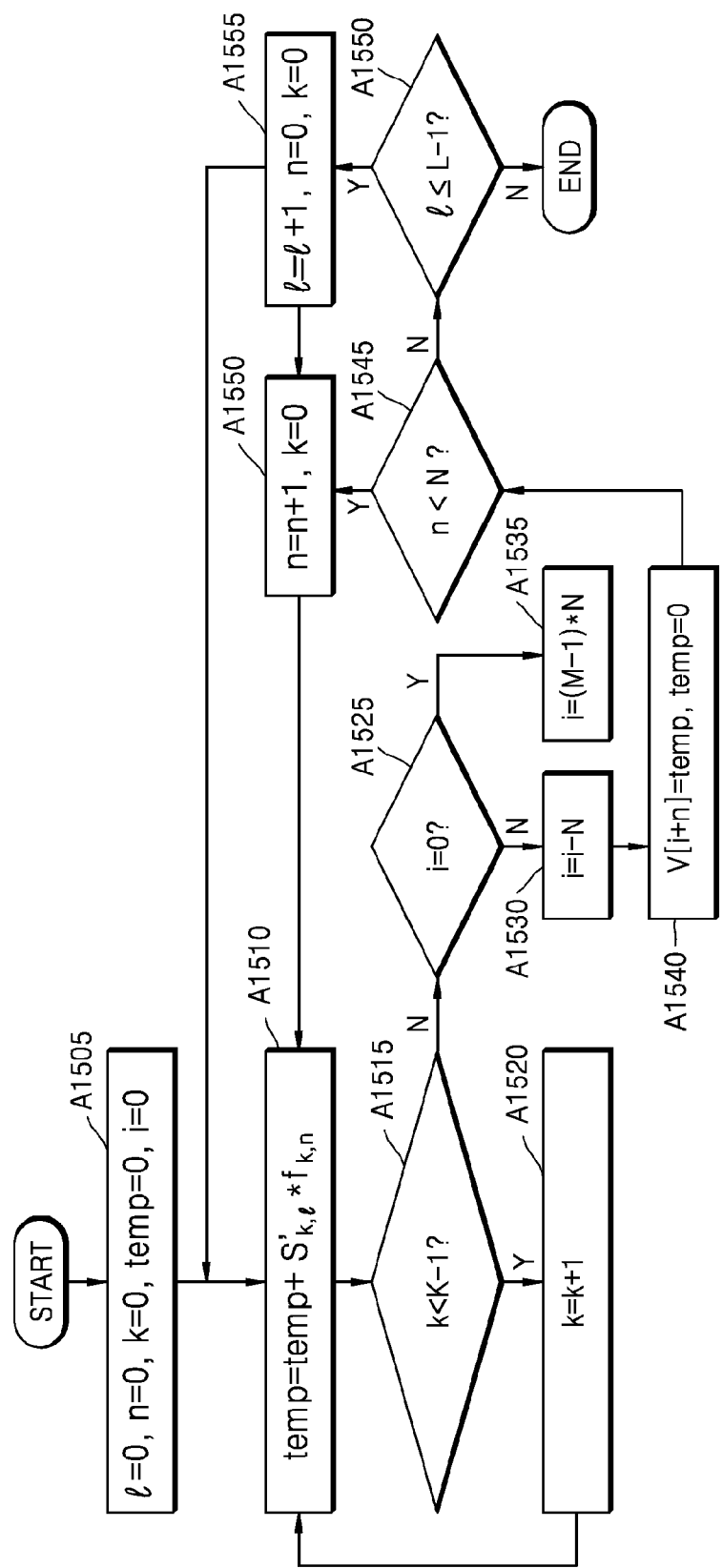
FIG. 15 is a flowchart for explaining a method of recording a sample array according to an embodiment of the disclosure.

FIG. 15 is a flowchart for explaining a method of recording a sample array according to an embodiment of the disclosure. Any redundant descriptions of the above-described embodiments will be omitted herein. Accordingly, the above-descriptions may be referred to without any special comments. Also, the disclosure is not limited to the embodiment of FIG. 15 and other methods of recording a sample array may be within the scope of the claimed subject matter.

First, the synthesis filtering device 11 may initialize various variables in Equation 8 (A1505). For example, a time slot index l, a sample index n, a sub-band index k, and a recording position index are all set to 0 (l=0, n=0, k=0, i=0) (A1505). A term "temp" may refer to a variable for temporarily storing a value output in the middle of a modulation process which may also be set to 0 (temp=0).

The synthesis filtering device 11 may perform an operation such that temp=temp+$S'_{k,l}$*$f_{k,n}$ according to Equation 8 (A1510). The synthesis filtering device 11 determines whether k<K−1 (A1515) and increases k by 1 until k=K−1 (A1520), thereby performing an operation such that temp=temp+$S'_{k,l}$*$f_{k,n}$.

When k=K−1, (i.e., k is not less than K−1), the synthesis filtering device 11 may determine whether the recording position index i is 0 (i=0) (A1525). If i≠0, the synthesis filtering device 11 may set the recording position index i to be i−N (i=i−N) (A1530). If i=0, the recording position index i to be (M−1)*N (i=(M−1)*N) (A1535).

The synthesis filtering device 11 may record the temp value at V[i+n] and initializes the temp (e.g., temp=0) (A1540).

The synthesis filtering device 11 may determine whether the sample index n is less than N (n<N) (A1545). The synthesis filtering device 11 may increase n by 1 until n=N and initializes k (e.g., n=n+1, k=0), and may repeat the modulation operation A1510 corresponding to a next sample index (A1550).

When n=N, (i.e., n is not less than N), the synthesis filtering device 11 may determine whether the current time slot l is less than the maximum time slot L (A1560). If l<L, the synthesis filtering device 11 changes the current time slot l to a next time slot, initializes n and k (e.g., n=0, k=0), and recursively performs the modulation operation A1510 with respect to a next time slot until l=L (A1555). When l=L, (i.e., l is greater than L−1), the synthesis filtering device 11 may determine the method of recording the sample array is complete.

Figure 16:
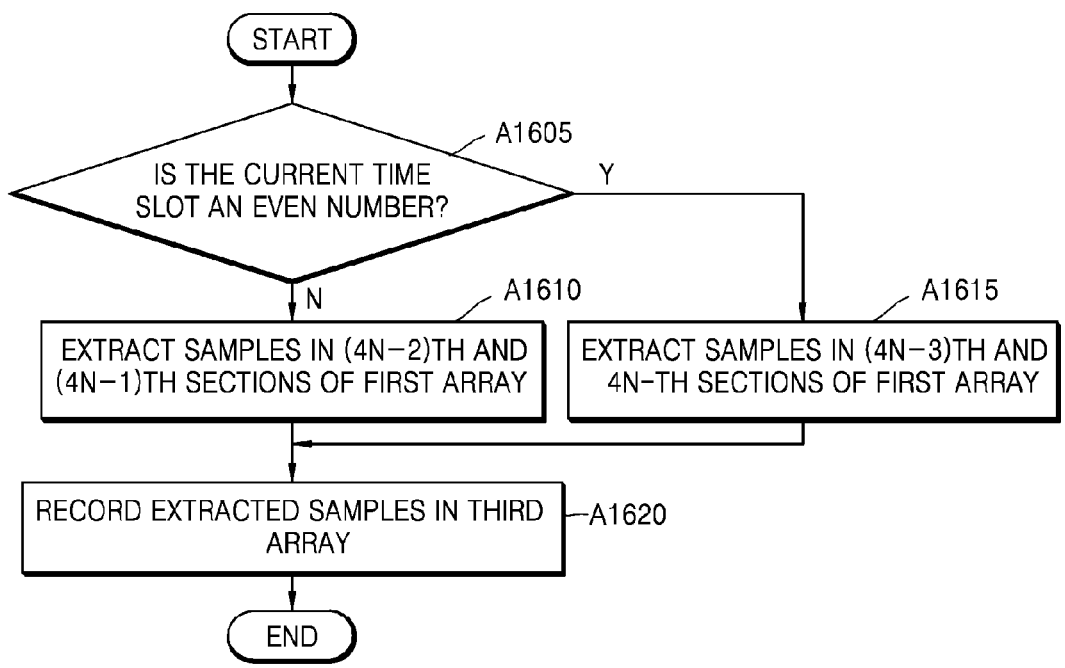
FIG. 16 is a flowchart for explaining a method of extracting a sample from a sample array according to an embodiment of the disclosure.

FIG. 16 is a flowchart for explaining a method of extracting a sample from a sample array according to an embodiment of the disclosure. Any redundant descriptions of the above-described embodiments will be omitted herein. Accordingly, the above-descriptions may be referred to without any special comments. Also, the disclosure is not limited to the embodiment of FIG. 16 and other methods of extracting a sample from a sample array may be within the scope of the claimed subject matter.

The synthesis filtering device 11 may determine whether the current time slot is an even number or an odd number (A1605). When the current time slot is an odd number, the synthesis filtering device 11 may extract samples in the (4n−2)th and (4n−1)th sections of the first array (A1610). When the current time slot is an even number, the synthesis filtering device 11 may extract samples in the (4n−3)th and 4n-th sections of the first array (A1615). For example, the synthesis filtering device 11 may extract samples according to Equation 9. According to Equation 9, (M*N/2) number of samples are extracted. When the current time slot is an odd number, the samples are extracted at a position [2*N*n+k+N/2]. As described above, k is an integer greater than or equal to 0 and less than N, and n is an integer greater than or equal to 0 and less than N/2.

The positions of the samples extracted from the first array when the current time slot is an even number, and the positions of the samples extracted from the first array when the current time slot is an odd number, may be mutually exclusive. For example, the synthesis filtering device 11 may determine the positions of the samples extracted from the first array such that the samples may be extracted at positions other than the positions where the samples are extracted in a previous time slot.

The synthesis filtering device 11 may record the extracted samples in a third array (A1620).

Figure 17:
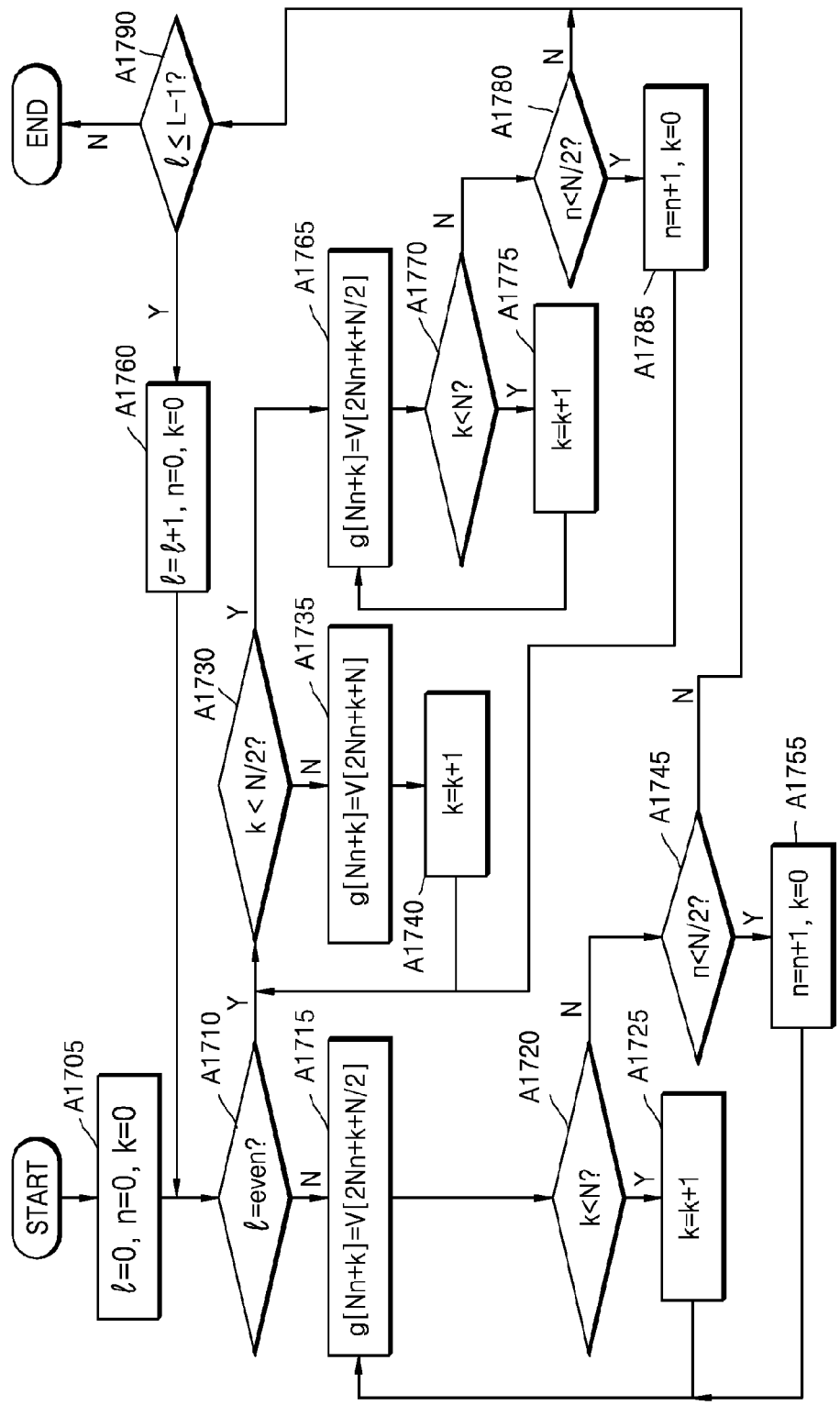
FIG. 17 is a flowchart for explaining a method of extracting a sample from a sample array according to an embodiment of the disclosure.

FIG. 17 is a flowchart for explaining a method of extracting samples from a sample array according to an embodiment of the disclosure. Any redundant descriptions of the above-described embodiments will be omitted herein. Accordingly, the above-descriptions may be referred to without any special comments. Also, the disclosure is not limited to the embodiment of FIG. 17 and other methods of extracting a sample from a sample array may be within the scope of the claimed subject matter.

The synthesis filtering device 11 may initialize variables according to Equation 9 (A1705). For example, the synthesis filtering device 11 may set each of the time slot index I, the sample index n, and the sub-band index k to 0.

The synthesis filtering device 11 may determine whether l is an even number (A1710). If l is not an even number, the synthesis filtering device 11 may increase k by 1 (A1725) until k=N (i.e., k is not less than N) (A1720), and may extract samples according to an equation such that g[Nn+k]=V[2Nn+k+N/2] (A1715).

When k=N, (i.e., k is not less than N), the synthesis filtering device 11 may determine whether n<N/2 (A1745). The synthesis filtering device 11 may increase n by 1 until n=N/2, initializes k, and recursively performs the sample extraction in operation A1715 (A1755).

When n is equal to N/2 (i.e., n is not less than N/2), the synthesis filtering device 11 may determine whether the time slot is less than the maximum time slot L (A1790). The synthesis filtering device 11 increases the time slot until l=L, and initializes n and k (e.g., n=0, k=0), to return to the operation A1710 (A1760). When l=L, (i.e., l is greater than L−1), the synthesis filtering device 11 may determine the method of extracting samples from a sample array is complete.

When l is determined to be an even number, the synthesis filtering device 11 may determine whether k<N/2 (A1730). The synthesis filtering device 11 may increase k by 1 until k=N/2 (i.e., k is not less than N/2), (A1740) and may extract samples according to an equation such that g[Nn+k]=V[2Nn+k+N] (A1735). When k=N/2, (i.e., k is not less than N/2), the synthesis filtering device 11 may determine whether k<N (A1770). The synthesis filtering device 11 may increase k by 1 until k=N (i.e., k is not less than N), (A1775) and may extract samples according to an equation such that g[Nn+k]=V[2Nn+k+N/2] (A1765). When k=N, (i.e., k is not less than N), the synthesis filtering device 11 may determine whether n<N/2 (A1780). The synthesis filtering device 11 increases n by 1 until n=N/2, (i.e., n is not less than N/2), and may initialize k (e.g., k=0) to return to operation A1730 (A1785). When n is N/2, (i.e., n is not less than N/2), the synthesis filtering device 11 returns to operation A1790.

Figure 18:
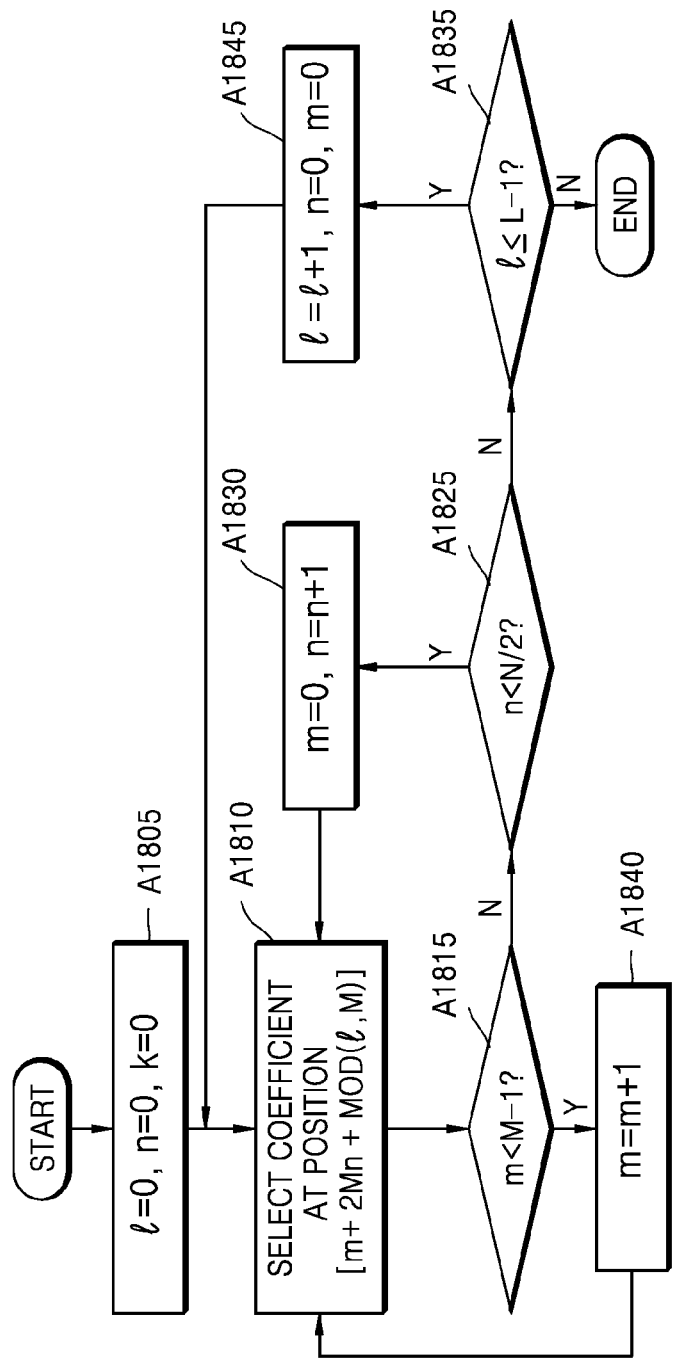
FIG. 18 is a flowchart for explaining a method of selecting a filter coefficient according to an embodiment of the disclosure.

FIG. 18 is a flowchart for explaining a method of selecting a filter coefficient according to an embodiment of the disclosure. Any redundant descriptions of the above-described embodiments will be omitted herein. Accordingly, the above-descriptions may be referred to without any special comments. Also, the disclosure is not limited to the embodiment of FIG. 18 and other methods of selecting a filter coefficient may be within the scope of the claimed subject matter.

First, the synthesis filtering device 11 may initialize variables according to Equation 11 (A1805). For example, the synthesis filtering device 11 may set each of the time slot index I, the sample index n, and the filter degree index m to 0.

The synthesis filtering device 11 may select a coefficient at a position [m+2Mn+MOD(I,M)] in the second array (A1810). The synthesis filtering device 11 may select a coefficient according to Equation 11. The synthesis filtering device 11 may perform a modulo operation by using a current time slot and a degree M of a filter and may select a filter coefficient from the second array based on a result of the modulo operation.

As described above, an identical filter coefficient is recorded twice in the second array. The positions where an identical filter coefficient is recorded are separated from each other by the filter degree M. Accordingly, the synthesis filtering device 11 may select (M*N/2) number of filter coefficients in the second array having a size of M*N where each of N-number of coefficient groups having consecutive M-number of filter coefficients as one group is consecutively recorded twice.

The synthesis filtering device 11 may select M-number of filter coefficients by increasing m by 1 (A1840). When m=M−1, (i.e., m is not less than M−1), the synthesis filtering device 11 may determine whether n<N/2 (A1825). The synthesis filtering device 11 may increase n by 1 until n=N/2, (i.e, n is not less than N/2), may initialize m (e.g., m=0), (A1830), and repeat the selecting of the filter coefficient of A1810. As described above, in each of M-number of groups that divides the samples extracted from the first array by a predetermined interval, a first filter coefficient and a second filter coefficient respectively corresponding to the n-th sample and the (n+1)th sample may be separated by 2M from each other in the second array.

When n=N/2, (i.e, n is not less than N/2) the synthesis filtering device 11 may determine whether the time slot is less than the maximum time slot L (A1835). The synthesis filtering device 11 increases the time slot by 1 until the time slot is equal to L (i.e., l is greater than L−1), initializes m and n (e.g., n=0, m=0), and returns to the operation A1810 (A1845). When the time slot is increased by 1, the positions of the filter coefficients selected from the second array may be shifted by 1 from the positions of the filter coefficients that are selected in the previous time slot. When l=L, (i.e., l is greater than L−1), the synthesis filtering device 11 may determine the method of selecting a filter coefficient is complete.

Figure 19:
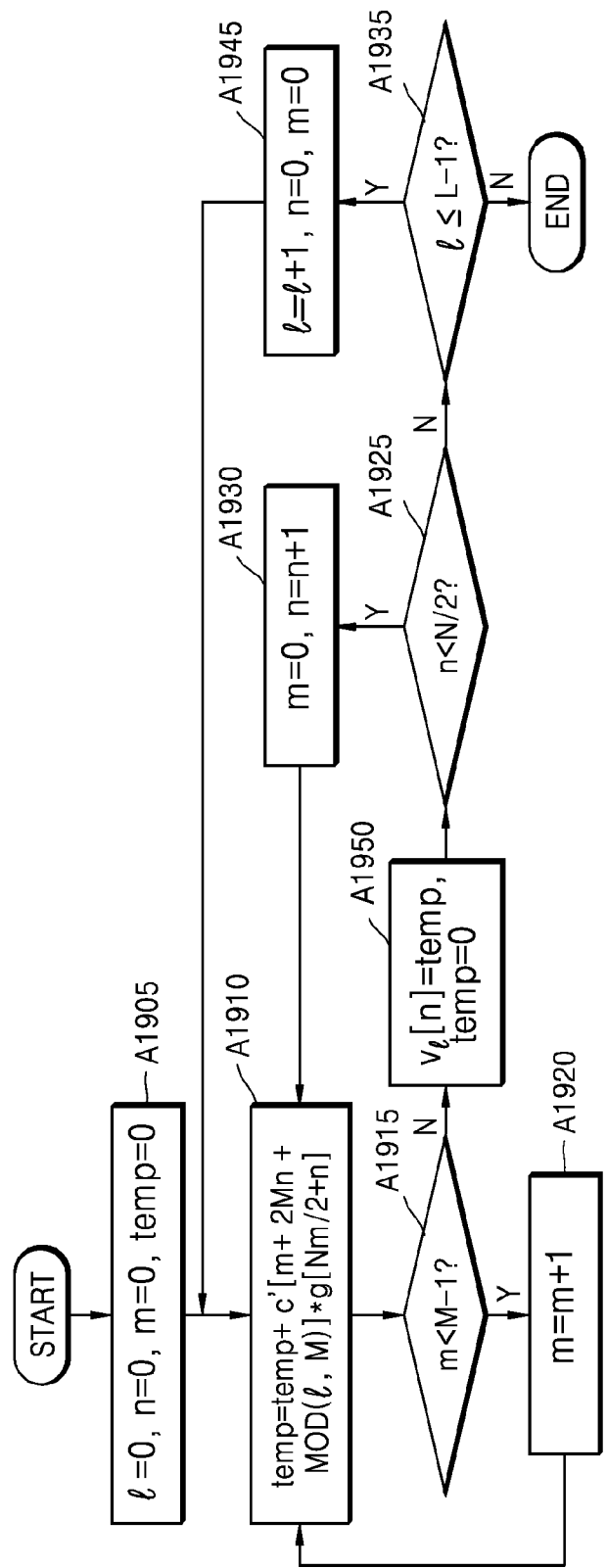
FIG. 19 is a flowchart for explaining a method of synthesizing a time domain sample according to an embodiment of the disclosure.

FIG. 19 is a flowchart for explaining a method of synthesizing a time domain sample according to an embodiment of the disclosure. Any redundant descriptions of the above-described embodiments will be omitted herein. Accordingly, the above-descriptions may be referred to without any special comments. Also, the disclosure is not limited to the embodiment of FIG. 19 and other methods of synthesizing a time domain sample may be within the scope of the claimed subject matter.

While some processes illustrated in FIGS. 18 and 19 are the same or similar, a process of multiplying a filter coefficient selected from FIG. 18 by a sample and accumulating a result of the multiplication is further added to the process of FIG. 19.

The synthesis filtering device 11 may initialize variables according to Equation 12 (A1905) (e.g., l=0, n=0, m=0). A term "temp" may refer to a variable for temporarily storing values output in the middle of the synthesis process of a time domain sample which may also be initialized (e.g., temp=0).

The synthesis filtering device 11 may synthesize an intermediate output value according to an equation such that temp=temp+c'[m+2Mn+MOD(l,M)]*g[Nm/2+n] (A1910). The synthesis filtering device 11 may repeat the operation A1910 by increasing m by 1 (A1920) until m=M−1 (i.e., m is not less than M−1) (A1915). When m=M−1, (i.e., m is not less than M−1), the synthesis filtering device 11 may store a value of temp in a time domain sample array $y_l[n]$ and may initialize temp (e.g., temp=0) (A1950).

The synthesis filtering device 11 may recursively perform the above-described process by increasing n by 1 (A1930). When n=N/2, (i.e., n is not less than N/2), the synthesis filtering device 11 may determine whether a current time slot is equal to the maximum time slot L (A1935). The synthesis filtering device 11 may increase the time slot by 1 (A1945) until l=L (A1935), and may recursively perform the above-described process, where n and m are initialized again (e.g., n=0, m=0) (A1945). When l=L, (i.e., l is greater than L−1), the synthesis filtering device 11 may determine the method of synthesizing a time domain sample is complete.

Figure 20:
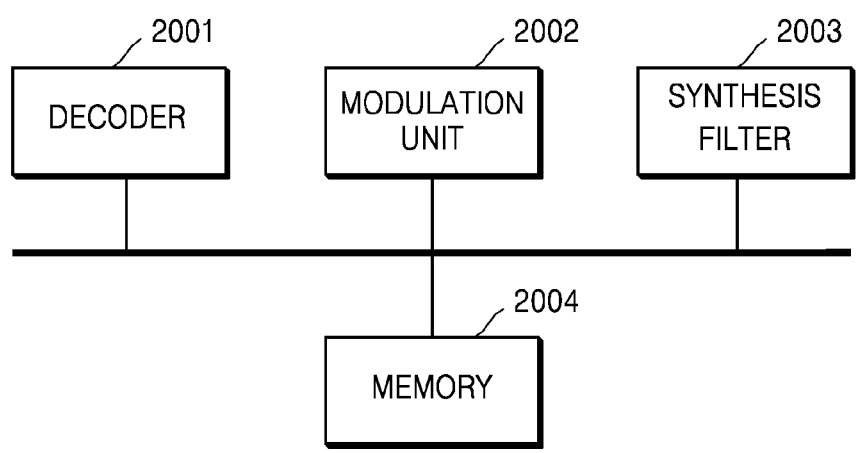
FIG. 20 is a block diagram of a synthesis filtering apparatus according to an embodiment of the disclosure.

FIG. 20 is a block diagram of the synthesis filtering apparatus 11 according to an embodiment of the disclosure. Any redundant descriptions of the above-described embodiments will be omitted herein. Accordingly, the above-descriptions may be referred to without any special comments. Also, all elements illustrated in FIG. 20 are not essential elements. Other common elements may be further provided in FIG. 20. The illustration of common elements is omitted to prevent making the subject matter of the disclosure unclear.

Referring to FIG. 20, the synthesis filtering device 11 may include a decoder 2001, a modulation unit 2002, a synthesis filter 2003, and a memory 2004. The decoder 2001 may decode an encoded bitstream and may output signals of a plurality of sub-bands. For example, the bitstream may be a multichannel audio bitstream. The memory 2004 may store the first array where the modulated samples of the sub-band signals are recorded and the second array where the filter coefficients are recorded. The above-described third array may also be stored in the memory 2004.

The modulation unit (modulator) 2002 may modulate the samples of the sub-band signals to k-number of sub-bands in the baseband and may store the modulated samples in the first array. The modulation unit 2002 may record new samples that are modulated corresponding to a current time slot by circulating sample recording positions in the first array according to a change in the time slot.

The synthesis filter 2003 may include a plurality of filters, some or all of which may be arranged in parallel, for example. To remove aliasing between adjacent sub-bands, the synthesis filter 2003 may extract samples from the first array, select filter coefficients corresponding to the extracted samples by using a modulo operation from the second array, and synthesize a time domain sample by using the extracted samples and the selected filter coefficients. The synthesis filter 2003 may determine the positions of samples to be extracted from the first array according to whether a current time slot is an even number or an odd number. In doing so, an identical filter coefficient may be recorded twice in the second array and the positions where an identical filter coefficient is recorded may be separated from each other by a degree of the synthesis filter 2003.

The synthesis filtering device 11 may be embodied by a variety of devices which may include multimedia content reproduction apparatuses, audio systems, home theater systems, amplifiers, mobile terminals, TV sets, computers, personal digital assistants (PDAs), tablet PCs, portable media players (PMPs), smart phones, or other types of electronic devices, and may be included as a part of the above-described devices.

In the analysis filtering process, a time domain sample is input and thus aliasing is removed, the time domain sample is transformed into K-number of sub-bands, and a modified discrete cosine transform (MDCT) transformation is performed. According to an embodiment, the memory update process may be omitted by performing modulo addressing on an array that records a time domain sample. Since the synthesis filtering process and the analysis filtering process have structures that correspond to each other, one of ordinary skill in the art may understand the analysis filtering process from the embodiments of the above-described synthesis filtering.

As described above, according to the QMF filtering method according to one or more of the above embodiments of the disclosure, QMF filtering may be quickly performed by reducing the complexity of QMF filtering, and power consumed for the QMF filtering may be reduced.

In addition, aspects of the above-described embodiments of the disclosure may also be implemented through computer readable code/instructions in/on a medium, e.g., a computer readable medium, to control at least one processing element to implement any above described embodiment. The medium can correspond to any medium/media permitting the storage and/or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media such as Internet transmission media. Thus, the medium may be such a defined and measurable structure including or carrying a signal or information, such as a device carrying a bitstream according to one or more embodiments of the disclosure.

For example, computer readable code and/or program instructions to implement embodiments disclosed herein may be recorded in non-transitory computer-readable media. The media may also include, alone or in combination with the program instructions, data files, data structures, and the like. Examples of non-transitory computer-readable media include magnetic media such as hard disks, floppy disks, and magnetic tape; optical media such as CD ROM disks and DVDs; magneto-optical media such as optical discs; and hardware devices that are specially configured to store and perform program instructions, such as read-only memory (ROM), random access memory (RAM), flash memory, USB memory, and the like. Examples of program instructions include both machine code, such as produced by a compiler, and files containing higher level code that may be executed by the computer using an interpreter. The program instructions may be executed by one or more processors. The described hardware devices may be configured to act as one or more software modules in order to perform the operations of the above-described embodiments, or vice versa. In addition, a non-transitory computer-readable storage medium may be distributed among computer systems connected through a network and computer-readable codes or program instructions may be stored and executed in a decentralized manner. In addition, the computer-readable storage media may also be embodied in at least one application specific integrated circuit (ASIC) or Field Programmable Gate Array (FPGA).

The QMF filtering system, synthesis filtering apparatus, and methods implemented using the QMF filtering system and/or synthesis filtering apparatus or portions thereof, according to the above-described example embodiments, may use one or more processors. For example, a processing device may be implemented using one or more general-purpose or special purpose computers, and may include, for example, one or more of a processor, a controller and an arithmetic logic unit, a central processing unit (CPU), a graphics processing unit (GPU), a digital signal processor (DSP), a microcomputer, a field programmable array, a programmable logic unit, an application-specific integrated circuit (ASIC), a microprocessor or any other device capable of responding to and executing instructions in a defined manner.

As disclosed herein, a memory may store one or more arrays and/or databases. A database may include a collection of data and supporting data structures which may be stored, for example, in a storage device such as a memory. For example, the memory may be embodied as a storage medium, such as a nonvolatile memory device, such as a Read Only Memory (ROM), Programmable Read Only Memory (PROM), Erasable Programmable Read Only Memory (EPROM), and flash memory, a USB drive, a volatile memory device such as a Random Access Memory (RAM), a hard disk, floppy disks, a blue-ray disk, or optical media such as CD ROM discs and DVDs, or combinations thereof. However, examples of the memory are not limited to the above description, and the memory may be realized by other various devices and structures as would be understood by those skilled in the art.

Each block of the flowchart illustrations may represent a unit, module, segment, or portion of code, which comprises one or more executable instructions for implementing the specified logical function(s). It should also be noted that in some alternative implementations, the functions noted in the blocks may occur out of order. For example, two blocks shown in succession may in fact be executed substantially concurrently (simultaneously) or the blocks may sometimes be executed in the reverse order, depending upon the functionality involved.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the disclosure have been described with reference to the figures, it will be understood by those of ordinary skill in the art that various changes in form and details may be made therein without departing from the spirit and scope of the disclosure as defined by the following claims.

What is claimed is:

1. A method of performing quadrature mirror filter (QMF) synthesis filtering, the method comprising:
   determining, by a modulator, positions of samples to be discarded from a first memory bank that comprises modulated QMF sub-band samples by performing a first modulo operation based on sample recording positions in a previous time slot;
   recording, by the modulator, at the determined positions, samples corresponding to a current time slot by replacing the samples recorded at the determined positions in the previous time slot with the samples corresponding to the current time slot;
   extracting, by a synthesis filter comprising at least one processor, samples from the first memory bank, wherein positions of the samples to be extracted are determined according to whether the current time slot is an even number or an odd number;
   determining, by the synthesis filter, filter coefficients corresponding to the extracted samples by performing a second modulo operation, according to the current time slot; and
   obtaining, by the synthesis filter, a time domain sample by accumulating results of multiplications of the extracted samples and the determined filter coefficients.

2. The method of claim 1, wherein, the determined positions are offset from the sample recording position in a previous time slot by N-number of the samples.

3. The method of claim 2, wherein, in the recording of the samples, when the sample recording position in the previous time slot is a start of the first memory bank, the samples are recorded from a last N-th position of the first memory bank.

4. The method of claim 1, wherein the recording of the samples comprises:
   generating N-number of real-number samples corresponding to K-number of sub-bands by inversely transforming K-number of complex sub-band samples that are transformed to a baseband; and
   recording the N-number of real-number samples at the determined positions.

5. The method of claim 1, wherein, in the extracting of the samples from the first memory bank, positions of the samples extracted from the first memory bank when the current time slot is an even number, and positions of the samples extracted from the first memory bank when the current time slot is an odd number, are mutually exclusive.

6. The method of claim 1, wherein, in the extracting of the samples from the first memory bank, when the first memory bank is divided into a plurality of sections, with respect to a natural number n, samples are extracted in (4n−3)th and 4n-th sections when the current time slot is an even number and samples are extracted in (4n−2)th and (4n−1)th sections when the current time slot is an odd number.

7. The method of claim 1, wherein the determining of the filter coefficients comprises:
performing the second modulo operation by using the current time slot and a degree of the synthesis filter; and
selecting the filter coefficients from a second memory bank based on a result of the modulo operation.

8. The method of claim 7, wherein an identical filter coefficient is recorded twice in the second memory bank and positions where the identical filter coefficient is recorded are separated from each other by the degree of the synthesis filter.

9. The method of claim 7, wherein positions of filter coefficients selected from the second memory bank are shifted by 1 from positions of the filter coefficients selected from a previous time slot.

10. The method of claim 1, wherein the determining positions of samples, the recording samples, the extracting samples, the determining filter coefficients, and the obtaining time domain samples, are recursively performed according to a change in the time slot.

11. The method of claim 1, wherein the first modulo operation comprises:
circulating sample recording positions in the first memory bank according to a change in a time slot, and
the positions of samples to be extracted from the first memory bank is determined based on the circulation of the sample recording positions.

12. The method of claim 1, wherein the samples are recorded in a recording section having a size of N, the recording section being determined by circulating recording sections of the first memory bank having a size of M*N according to a change in a time slot, the first memory bank being recorded in a memory, and
the filter coefficients are selected from a second memory bank which includes a second predetermined number of coefficient groups having M-number of filter coefficients in each group, each of the coefficient groups being recorded twice in the second memory bank, the second memory bank being recorded in the memory.

13. A non-transitory computer readable recording medium having recorded thereon one or more programs, that when executed, implements the method of claim 1.

14. An apparatus for performing quadrature mirror filter (QMF) synthesis filtering, the apparatus comprising:
a memory to record a first memory bank where modulated samples of a sub-band signal are recorded and to record a second memory bank where filter coefficients are recorded;
a modulator to modulate samples of a sub-band signal to k-number of sub-bands in a baseband, to determine positions of samples to be discarded from the first memory bank that comprises modulated QMF sub-band samples by performing a first modulo operation based on sample recording positions in a previous time slot and to record, at the determined positions, samples corresponding to a current time slot by replacing the samples recorded at the determined positions in the previous time slot with the samples corresponding to the current time slot; and
a synthesis filter, comprising at least one processor, to extract samples from the first memory bank, wherein positions of the samples to be extracted are determined according to whether the current time slot is an even number or an odd number, to determine filter coefficients corresponding to the extracted samples by performing a second modulo operation, according to the current time slot and to obtain a time domain sample by accumulating results of multiplications of the extracted samples and the determined filter coefficients.

* * * * *